United States Patent [19]

Okamura

[11] Patent Number: 5,528,542
[45] Date of Patent: Jun. 18, 1996

[54] SENSE AMPLIFIER

[75] Inventor: Junichi Okamura, Yokohama, Japan

[73] Assignee: Kabushiki Kaisha Toshiba, Kawasaki, Japan

[21] Appl. No.: 305,716

[22] Filed: Sep. 14, 1994

[30] Foreign Application Priority Data

Sep. 16, 1993 [JP] Japan ................... 5-229904
Sep. 9, 1994 [JP] Japan ................... 6-216264

[51] Int. Cl.$^6$ ................................ G11C 11/411
[52] U.S. Cl. ............ 365/205; 365/174; 257/365; 257/368; 257/401
[58] Field of Search .................... 365/205, 189.01, 365/174; 257/365, 368, 401, 369

[56] References Cited

U.S. PATENT DOCUMENTS 4,949,306  8/1990  Nakagome et al. ........... 365/189.01
5,175,604  12/1992  Nogami ........................ 257/369
5,394,354  2/1995  Watabe et al. ............... 365/205

FOREIGN PATENT DOCUMENTS

0474238A2  11/1992  European Pat. Off. .
5-210973  8/1993  Japan .

Primary Examiner—Viet Q. Nguyen
Attorney, Agent, or Firm—Banner & Allegretti, Ltd.

[57] ABSTRACT

An integrated circuit pattern of a sense amplifier is disclosed. The sense amplifier includes a sense circuit connected to a memory array and a column gate. The sense circuit includes N-MOSFETs cross-coupled between paired bit lines. The column gate includes an N-MOSFET for connecting the bit line to a data line and an N-MOSFET for connecting the other bit line to another data line. The N-MOSFET contained in the sense circuit and the N-MOSFET contained in the column gate are integrated in one element region. Further, the N-MOSFET contained in the sense circuit and the N-MOSFET contained in the column gate are integrated in another element region.

93 Claims, 24 Drawing Sheets

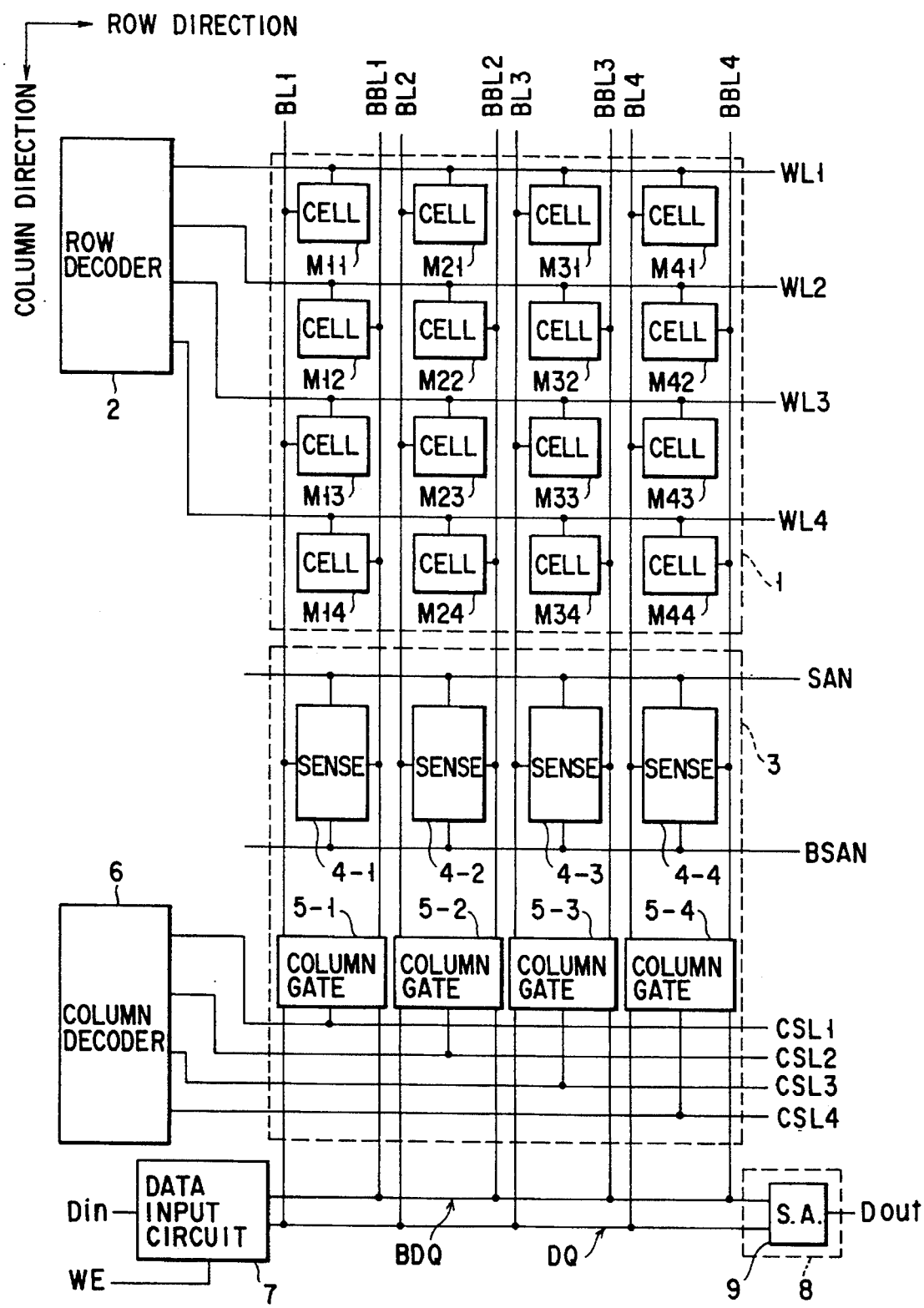
F I G. 2

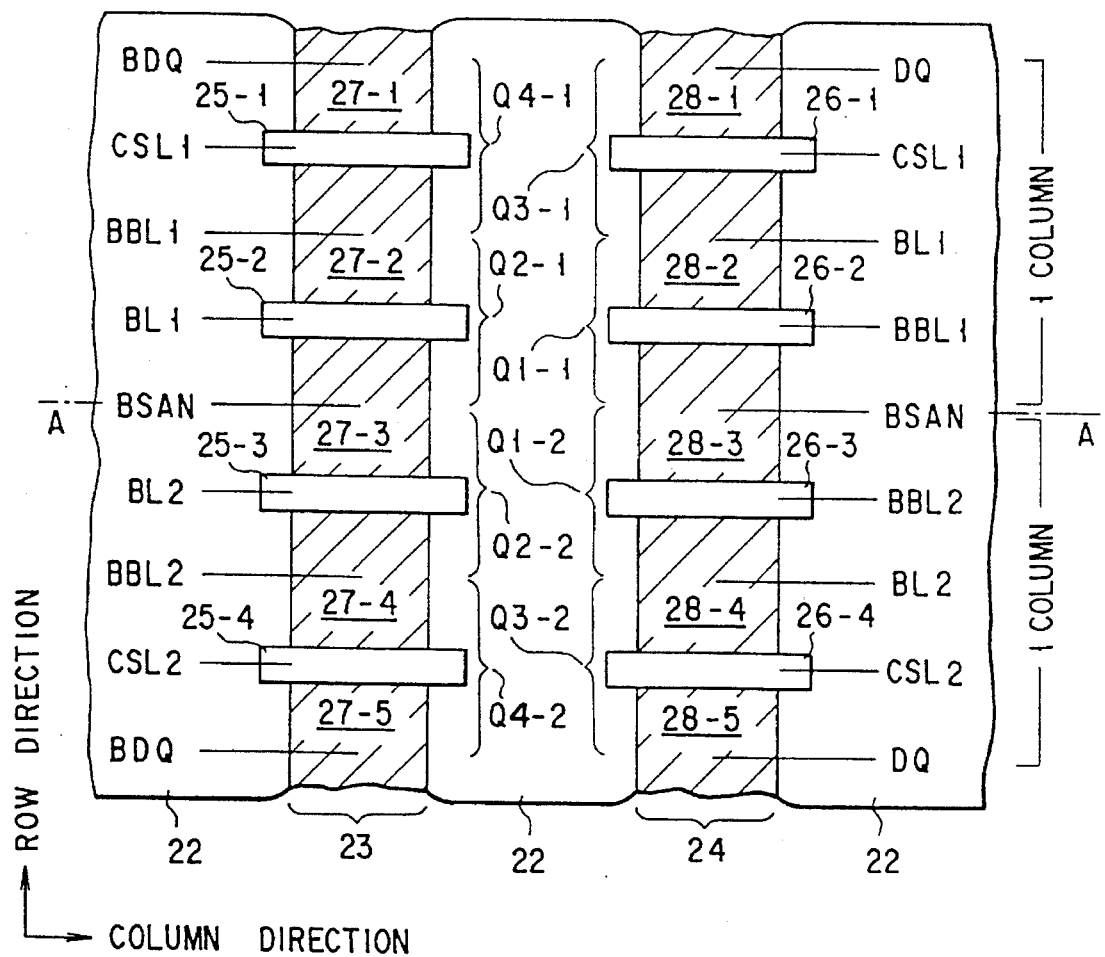
F I G. 5

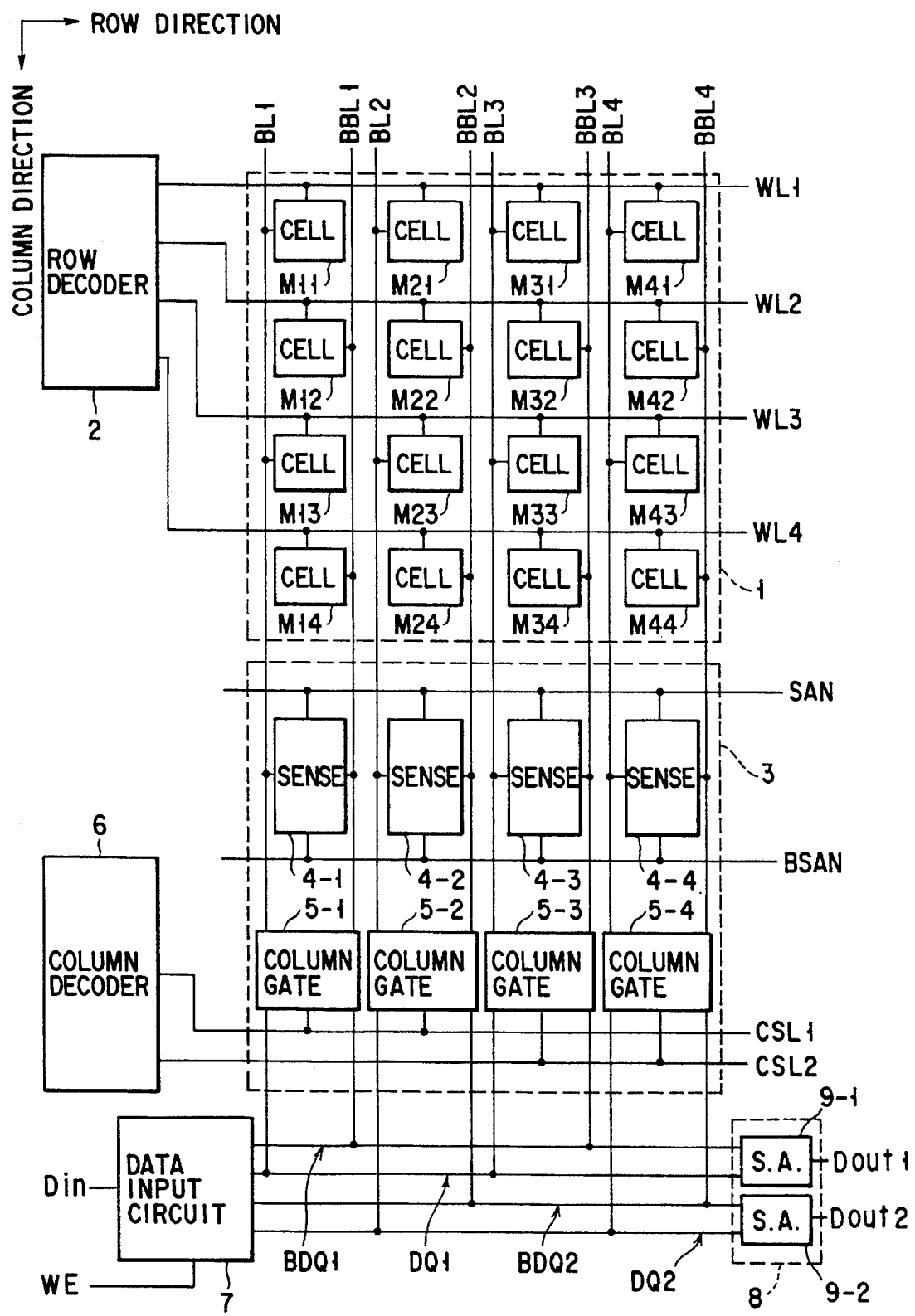
F I G. 7

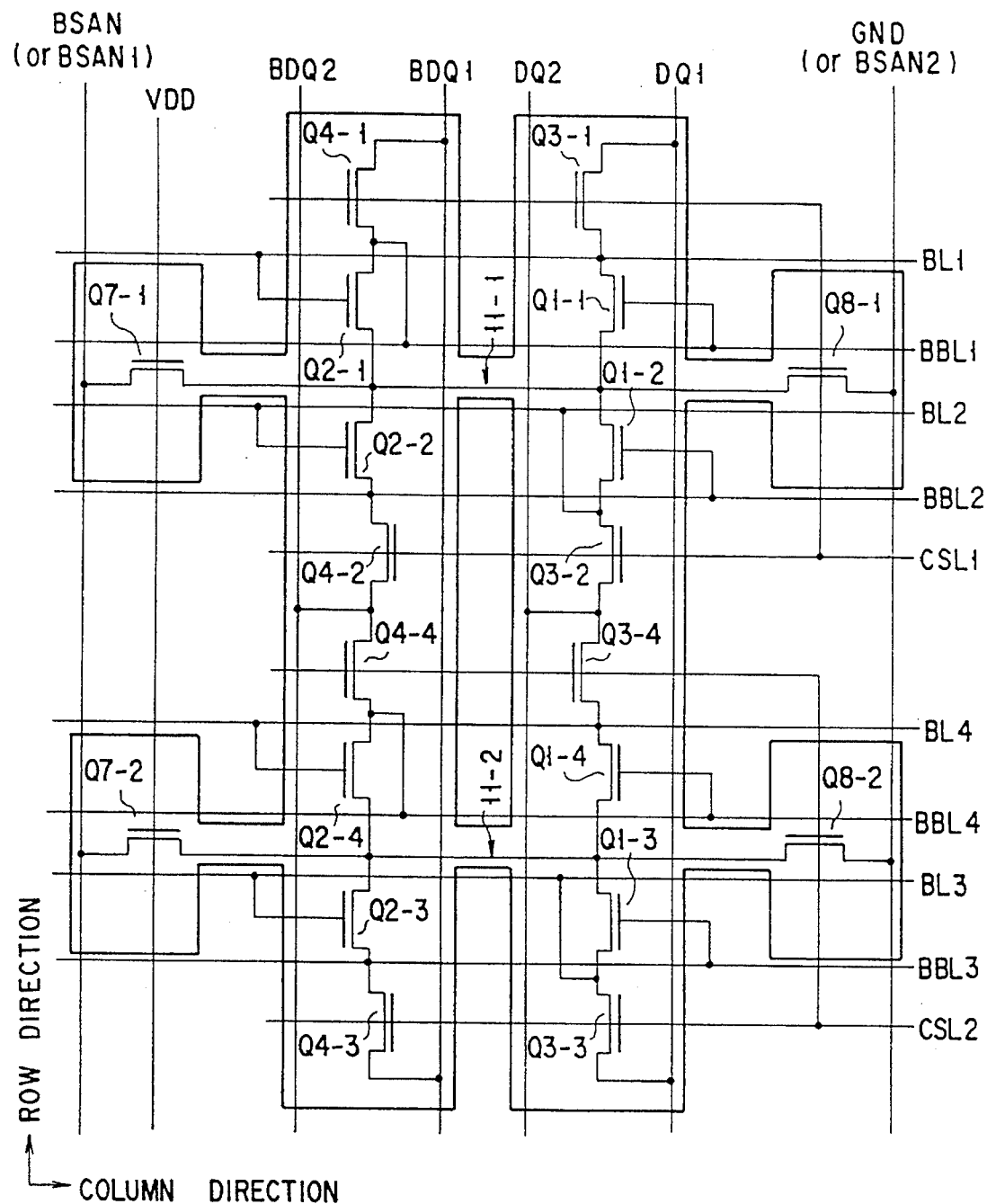
F I G. 15C

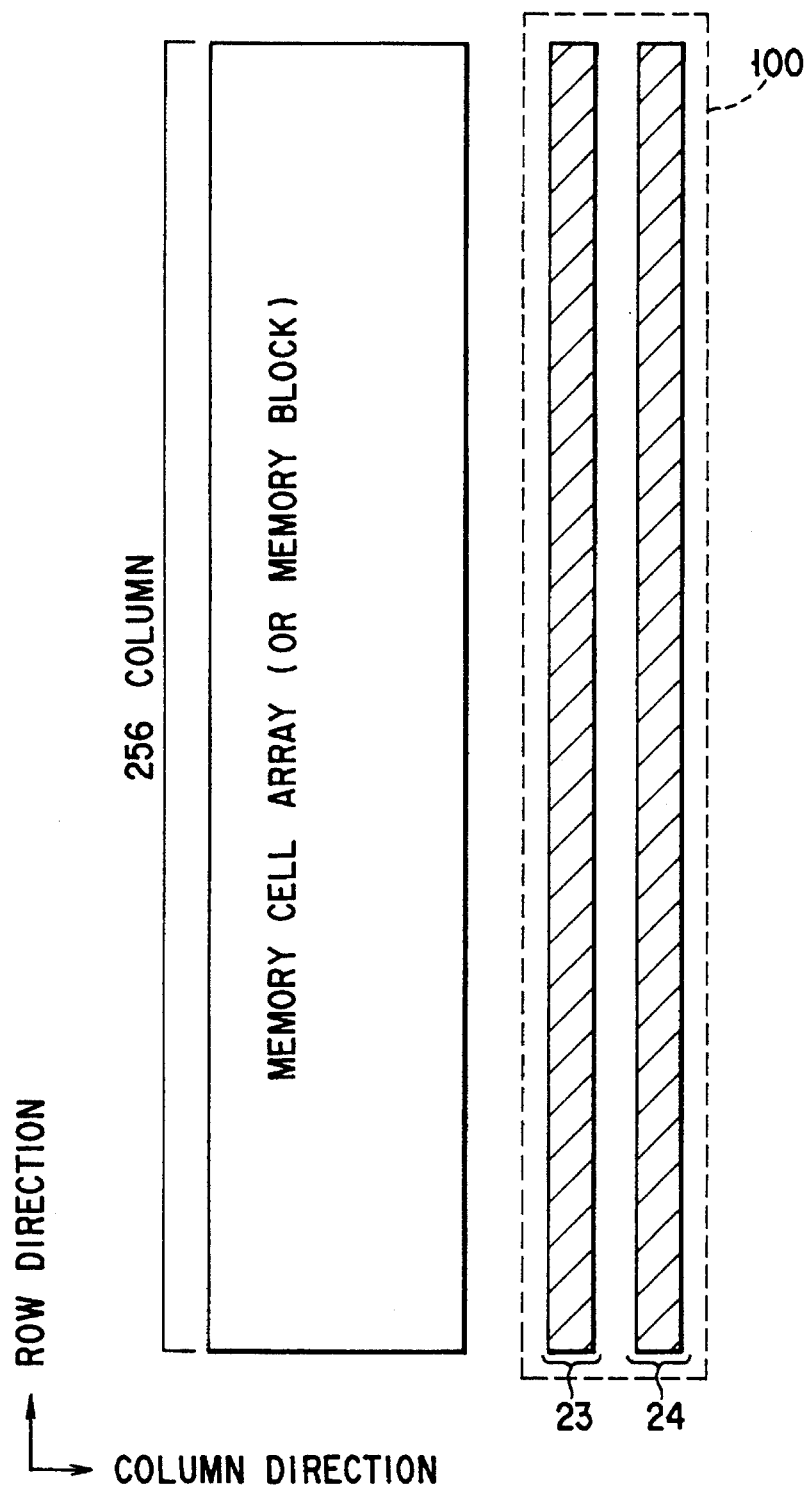
F I G. 16A

SENSE AMPLIFIER

BACKGROUND OF THE INVENTION

1. Field of the Invention

This invention relates to a sense amplifier, and more particularly to a sense amplifier which is used in a semiconductor memory device and has a function of amplifying a signal flowing in a bit line and transmitting the amplified signal to a data line.

2. Description of the Related Art

At present, in a typical dynamic semiconductor memory device, paired bit lines are connected to a memory cell and a potential difference between the paired bit lines is amplified by a sense amplifier so as to amplify a signal flowing in the bit line.

The sense amplifier includes a sense circuit for sensing and amplifying a potential difference between the paired bit lines. As the sense amplifier, a sense amplifier having two transistors cross-coupled between the paired bit lines is generally used.

Further, bit line pairs of a number corresponding to a preset number of columns are provided. When data is read out from a memory cell or data is written into a memory cell, a desired bit line pair is selected from a plurality of bit line pairs by a column selection signal output from a column decoder. A column gate is provided between the bit line pair and the data line pair to electrically connect or disconnect the bit line pair to or from the data line pair according to the column selection signal.

FIG. 1 is a general circuit diagram of this type of circuit. In FIG. 1, one column (one bit line pair) is shown.

As shown in FIG. 1, a bit line BL and an inverted bit line BBL (in this specification, the head symbol "B" indicates an inverted signal) which makes a pair with the bit line BL are provided to make a bit line pair in a semiconductor memory device.

A sense amplifier circuit 4 is connected between the paired bit lines BL and BBL and is constructed by N-channel MOSFETs (which are hereinafter referred to as NMOSs) Q1 and Q2 and P-channel MOSFETs (which are hereinafter referred to as PMOSs) Q5 and Q6.

The source of the NMOS Q1 is connected to an inverted sense signal line BSAN, the drain thereof is connected to the bit line BL, and the gate thereof is connected to the inverted bit line BBL. The source of the NMOS Q2 is connected to the inverted sense signal line BSAN, the drain thereof is connected to the inverted bit line BBL, and the gate thereof is connected to the bit line BL. The source of the PMOS Q5 is connected to a sense signal line SAN, the drain thereof is connected to the bit line BL, and the gate thereof is connected to the inverted bit line BBL. The source of the PMOS Q6 is connected to the sense signal line BSAN, the drain thereof is connected to the inverted bit line BBL, and the gate thereof is connected to the bit line BL.

Further, a column gate 5 is connected between paired data lines DQ, BDQ on one hand and connection nodes between the sense circuit and the paired bit lines BL, BBL on the other. The column gate 5 includes NMOSs Q3 and Q4.

The source of the NMOS Q3 is connected to the bit line BL, the drain thereof is connected to the data line DQ, and the gate thereof is connected to a column selection signal line CSL. The source of the NMOS Q4 is connected to the inverted bit line BBL, the drain thereof is connected to the inverted data line BDQ, and the gate thereof is connected to the column selection signal line CSL.

As described above, in the general circuit, four NMOSs and two PMOSs are used for one column. In order to form the transistors in the semiconductor substrate, it is necessary to form a region for isolating the transistors from one another, that is, an element isolation region such as a field oxide film so as to provide an element region on the semiconductor substrate. Since the sense amplifier has six elements, six element regions are basically required.

Particularly, when attention is given only to the NMOS circuit portion, four element regions must be provided.

However, in the above sense amplifier, particularly in the NMOS circuit portion, four element regions must be provided, and therefore, there occurs a problem that an area occupied by the element isolation region on the substrate is increased. This makes it difficult to reduce the size of the chip.

SUMMARY OF THE INVENTION

This invention has been made in order to solve the above problem and an object of this invention is to provide a sense amplifier in which the area of a region for isolating of the sense amplifier from one another can be reduced and the chip size can be reduced.

In order to attain the above object, in this invention, a column gate and a sense circuit are provided and the element pattern of the column gate and the element pattern of the sense circuit are unified.

With this construction, by mixedly forming the elements in the column gate together with the elements in the sense circuit as a pattern, the area of the element isolation region required for isolating the element regions from one another can be reduced and the chip size can be reduced.

Further, since the elements of the column gate and the elements of the sense circuit are unified in a pattern form, a sense amplifier necessary for an increased number of columns can be obtained by repeatedly arranging the above construction in one element region even if the number of columns is increased with an increase in the memory capacity. That is, the above construction can be limitlessly repeated in one element region.

Thus, since the sense amplifier can be limitlessly repeated in one element region, the reduction rate of the chip size is automatically increased with an increase in the memory capacity of the semiconductor memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram of a dynamic RAM to which a sense amplifier according to a first embodiment of this invention can be applied;

FIG. 5 is a plan view showing the layout pattern obtained when the layout pattern shown in FIG. 4A is extended for two columns;

FIG. 7 is a block diagram of a dynamic RAM to which a sense amplifier according to a second embodiment of this invention can be applied;

FIG. 15C is an equivalent circuit diagram of the sense amplifier shown in FIGS. 14A and 14B;

FIG. 16A is a plan view showing the element region pattern and memory cell array of a sense amplifier according to this invention;

DETAILED DESCRIPTION OF THE PREFERRED EMBODIMENTS

Figure 1:
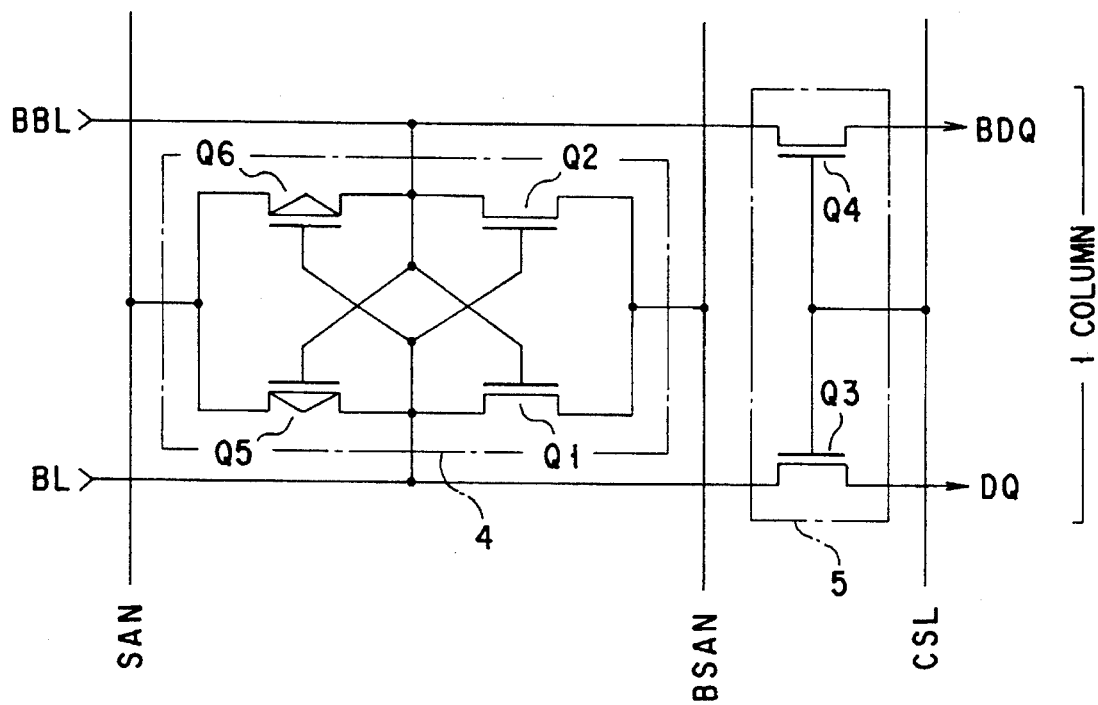
FIG. 1 is a general circuit diagram showing a sense circuit and column gate.

There will now be described an embodiment of this invention with reference to the accompanying drawings. In this explanation, portions which are common throughout the drawings are denoted by the same reference numerals and the repetitive explanation therefor is omitted.

FIG. 2 is a block diagram showing the schematic construction of a dynamic RAM to which a sense amplifier according to a first embodiment of this invention can be applied.

As shown in FIG. 2, a memory cell matrix (array) 1 having a plurality of dynamic memory cells M11 to M44 formed in a matrix form is provided on a semiconductor chip. In this case, each of the memory cells M11 to M44 is constructed by a one-transistor/one-capacitor type cell having a drain connected to a bit line and a source connected to a capacitor.

A corresponding one of word lines WL1 to WL4 is commonly connected to the gates of those memory cells which lie on the same row and the word lines WL1 to WL4 are connected at one-side ends to a row decoder 2 which selects a desired row according to a row address signal (not shown).

The drains of those memory cells which are arranged on the same column are basically connected to one bit line, but in this embodiment, the drains of those memory cells which are arranged on the same column are alternately connected to a bit line BL (BL1 to BL4) and an inverted bit line BBL (BBL1 to BBL4), and the paired bit lines constitute a column. The arrangement configuration of the paired bit lines is a folded bit line configuration.

The paired bit lines BL and BBL are connected at one-side ends to a sense amplifier 3 for amplifying a potential difference between the paired bit lines. The sense amplifier 3 includes sense circuits 4-1 to 4-4 and column gates 5-1 to 5-4 provided for the respective bit line pairs (respective columns).

At the present state of technology, it is generally considered that the sense amplifier 3 is formed of only a cross-coupled sense circuit, that is, the sense circuit 4, but in this invention, as will be understood from the later description, since the sense circuit 4 and the column gate 5 are mixedly formed together with each other, the sense amplifier 3 is defined to include the sense circuit 4 and the column gate 5 in this specification.

Each of the sense circuits 4-1 to 4-4 is supplied with a sense signal SAN and an inverted signal BSAN. Further, the column gates 5-1 to 5-4 are respectively 10 supplied with column select signals CSL1 to CSL4. Interconnections for supplying the column select signals CSL1 to CSL4 to the column gates 5-1 to 5-4 are connected to a column decoder 6. The column decoder 6 creates the column select signals CSL1 to CSL4 based on a column address signal (not shown).

The sense circuit 4-1 which is one of the sense circuits is taken as an example and explained. The sense circuit 4-1 is connected between the bit lines BL1 and BBL1 and is made conductive when a sense signal SAN and an inverted signal BSAN thereof are supplied thereto.

Likewise, the column gate 5-1 which is one of the column gates is taken as an example and explained. The column gate 5-1 is connected between the paired bit lines BL1, BBL1 and paired data lines DQ, BDQ and is made conductive when the column select signal CSL1 is supplied thereto.

The paired data lines DQ, BDQ are connected at one-side ends to an input circuit 7. The input circuit 7 guides input data Din to the paired data lines DQ, BDQ based on a write enable signal WE at the time of a writing operation. The input data Din guided to the paired data lines DQ, BDQ is supplied to the bit line pair (column) via one of the column gates 5-1 to 5-4 which is selected by the column decoder 6 and set in the conductive state. Further, the input data Din supplied to the column is supplied to a memory cell which is selected by the row decoder 2 and set in the conductive state and stored therein.

Further, the other ends of the paired data lines DQ and BDQ are connected to an output amplifier section 8. The output amplifier section 8 includes a sense amplifier 9 having the paired data lines DQ and BDQ as differential inputs. The sense amplifier 9 outputs data Dout of "1" level, for example, when a potential difference occurs between the paired data lines DQ and BDQ and outputs data Dout of "0" level, for example, when no potential difference occurs between the paired data lines DQ and BDQ.

Next, the sense amplifier 3 is explained in detail. This explanation is made only for one column.

Figure 3:
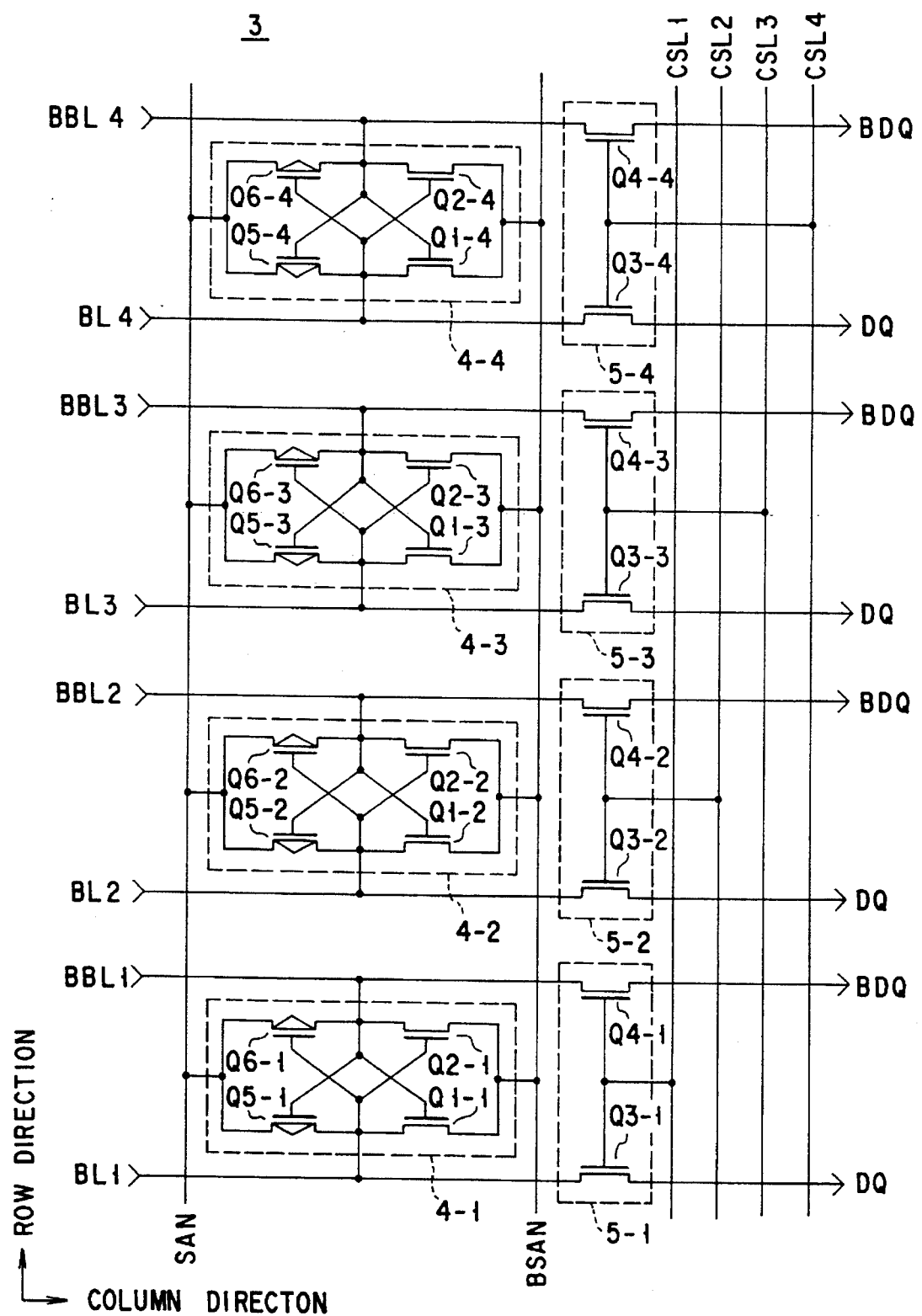
FIG. 3 is a circuit diagram of the sense amplifier shown in FIG. 2.

FIG. 3 is a circuit diagram of the sense amplifier 3 shown in FIG. 2.

As shown in FIG. 3, the sense circuit 4-1 includes an NMOS Q1-1 which has a source connected to the inverted sense signal line BSAN, a drain connected to the bit line BL1, and a gate connected to the inverted bit line BBL1 and an NMOS Q2-1 which has a source connected to the inverted sense signal line BSAN, a drain connected to the inverted bit line BBL1, and a gate connected to the bit line BL1. Further, in the sense circuit 4-1 of this embodiment, a PMOS Q5-1 having a source connected to the sense signal line SAN, a drain connected to the bit line BL1, and a gate connected to the inverted bit line BBL1 and a PMOS Q6-1 having a source connected to the sense signal line SAN, a drain connected to the inverted bit line BBL1, and a gate connected to the bit line BL1 are provided to construct a CMOS sense circuit.

Further, the column gate 5-1 includes an NMOS Q3-1 which has a source connected to the bit line BL1, a drain connected to the data line DQ, and a gate connected to the column selection signal line CSL1, and an NMOS Q4-1 which has a source connected to the inverted bit line BBL1, a drain connected to the inverted data line BDQ1, and a gate connected to the column selection signal line CSL1.

Figure 4A:
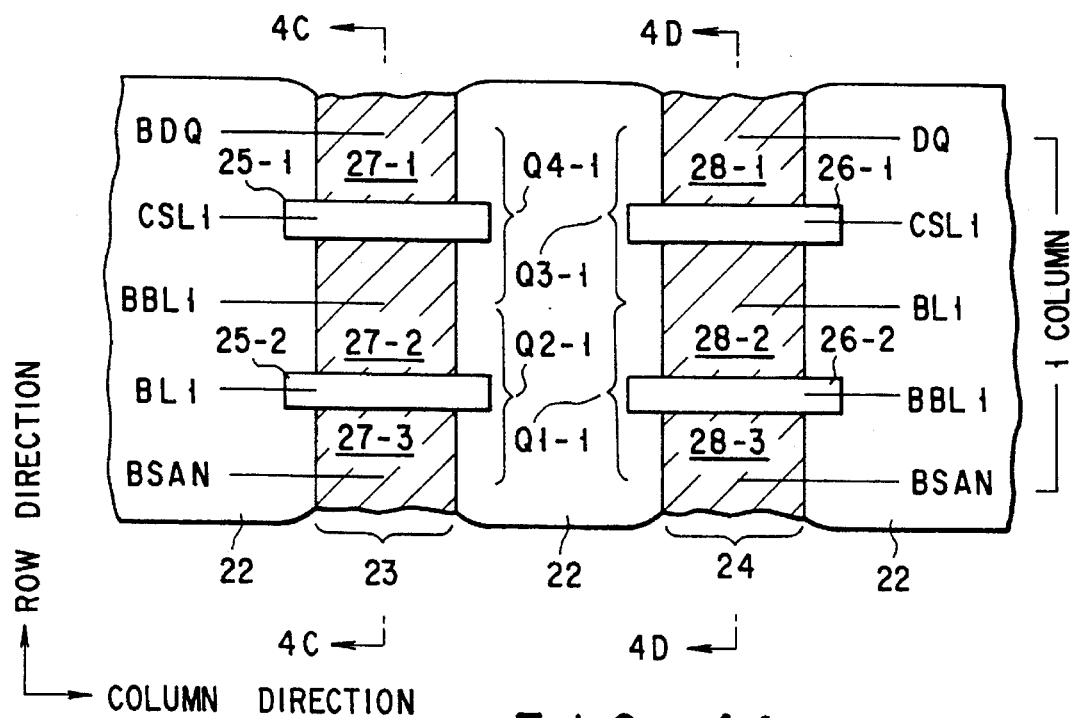
FIG. 4A is a plan view showing the layout pattern of the sense amplifier according to the first embodiment of this invention.

In a dynamic RAM including the sense amplifier 3 with the above construction, in order to eliminate an ineffective area for the device to a maximum degree and enhance the reduction rate of the size, the element layout pattern of the sense amplifier 3 is formed with the configuration shown in FIG. 4A in this invention.

Figure 4B:
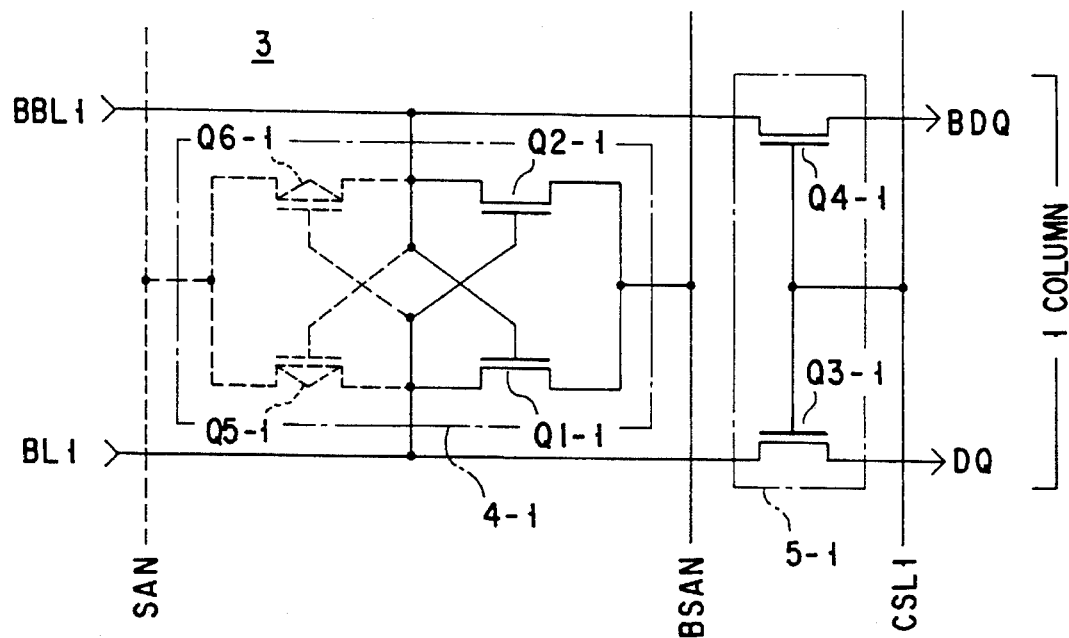
FIG. 4B is an equivalent circuit diagram of the sense amplifier shown in FIG. 4A.
Figure 4C:
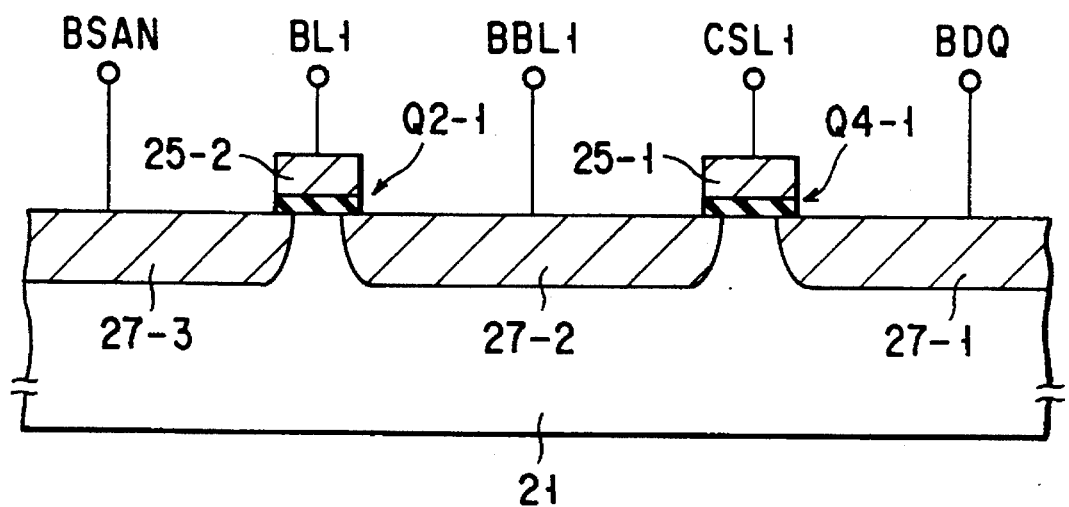
FIG. 4C is a cross sectional view taken along the line 4C—4C of FIG. 4A.
Figure 4D:
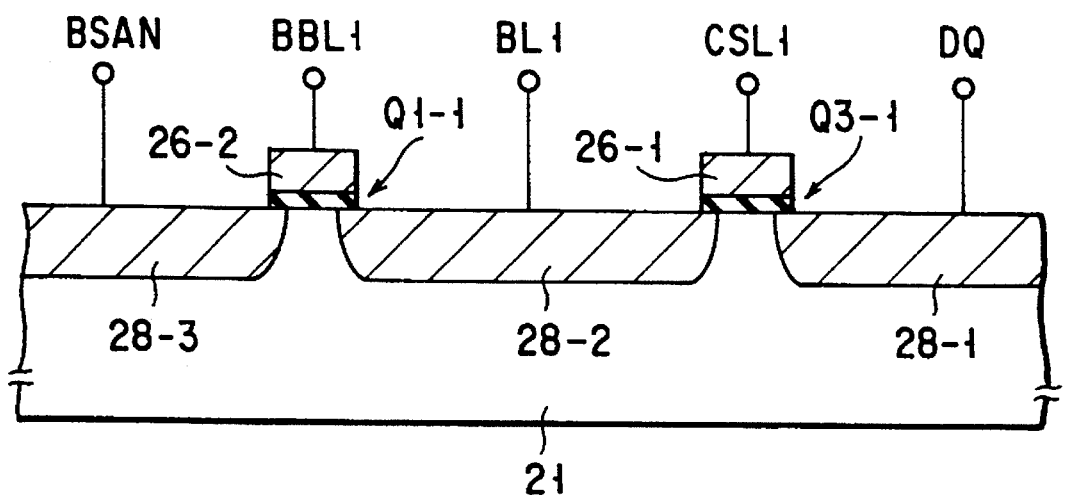
FIG. 4D is a cross sectional view taken along the line 4D—4D of FIG. 4A.

FIG. 4A is a plan view showing the layout pattern of a sense amplifier according to a first embodiment of this invention, FIG. 4B is an equivalent circuit diagram thereof, FIG. 4C is a cross sectional view taken along the line 4C—4C of FIG. 4A, and FIG. 4D is a cross sectional view taken along the line 4D—4D of FIG. 4A. In FIG. 4A, the NMOS portion of the sense circuit 4-1 and the layout pattern of the column gate 5-1 within the sense amplifier 3 are mainly shown. That is, a circuit portion having interconnections indicated by solid lines in FIG. 4B is shown.

As shown in FIGS. 4A, 4C and 4D, an element isolation region 22 formed of a field oxide film or the like is formed in the surface area of a P-type silicon substrate 21. Element regions 23 and 24 are defined in the main surface area of the substrate 21 by the element isolation region 22. Conductive polysilicon layers 25-1 and 25-2 which are used as the gates of the MOSFET are formed in separated positions on the element region 23, and likewise, conductive polysilicon layers 26-1 and 26-2 which are used as the gates of the MOSFET are formed in separated positions on the element region 24. N-type diffused layers 27-1 to 27-3 are formed in an area of the element region 24 except portions which are covered with the polysilicon layers 25-1 and 25-2 and the diffused layers 27-1 to 27-3 function as a source or drain of the MOSFET. Likewise, N-type diffused layers 28-1 to 28-3 are formed in an area of the element region 24 except portions which are covered with the polysilicon layers 26-1 and 26-2 and the diffused layers 28-1 to 28-3 function as a source or drain of the MOSFET.

The layout pattern shown in FIG. 4A is explained. NMOSs Q1-1 and Q3-1 connected to the bit line BL1 are formed in the element region 24. The NMOS Q1-1 is formed in a MOSFET portion having a gate formed of the polysilicon layer 26-2 and the NMOS Q3-1 is formed in a MOSFET portion having a gate formed of the polysilicon layer 26-1.

Further, the drain of the NMOS Q1-1 and the source of the NMOS Q3-1 are formed in one N-type diffused layer 28-2 and formed as a common region. The diffused layer 28-2 is connected to the bit line BL1. The N-type diffused layer 28-1 is connected to the data line DQ and the N-type diffused layer 28-3 is connected to the inverted sense signal line BSAN.

On the other hand, NMOSs Q2-1 and Q4-1 connected to the inverted bit line BBL1 are formed in the element region 23. The NMOS Q2-1 is formed in a MOSFET portion having a gate formed of the polysilicon layer 25-2 and the NMOS Q4-1 is formed in a MOSFET portion having a gate formed of the polysilicon layer 25-1.

Like the above case, the drain of the NMOS Q2-1 and the source of the NMOS Q4-1 are formed in one N-type diffused layer 27-2 and formed as a common region. The diffused layer 27-2 is connected to the inverted bit line BBL1. The N-type diffused layer 27-1 is connected to the inverted data line BDQ and the N-type diffused layer 27-3 is connected to the inverted sense signal line BSAN.

For a circuit portion having interconnections indicated by broken lines in FIG. 4B, that is, the PMOS portion of the cross-coupled latch type sense circuit 4-1, for example, an N-type well region is formed in a P-type silicon substrate 21 to form an element isolation region in the well region so as to define the element region, although not specifically shown in the drawing. In the thus defined element region, PMOSs Q5-1 and Q6-1 are formed.

An example obtained by extending the layout pattern of the construction shown in FIG. 4A for two columns (two bits) is shown in FIG. 5.

As shown in FIG. 5, when it is extended for two columns, the configuration can be obtained basically by folding the layout pattern of FIG. 4A along the portion of the diffused layers 27-1 and 28-3, that is, along the A—A line in FIG. 5.

As shown in FIG. 5, NMOSs Q1-2 and Q3-2 will be provided in the element region 24 by symmetrically folding the pattern explained with reference to FIG. 4A along the A—A line. In this case, the NMOS Q1-2 is formed in a MOSFET portion having a gate formed of a polysilicon layer 26-3 and the NMOS Q3-2 is formed in a MOSFET portion having a gate formed of a polysilicon layer 26-4. Then, the drain of the NMOS Q1-2 and the source of the NMOS Q3-2 are formed in the same N-type diffused layer 28-4 and formed as a common region. The diffused layer 28-4 is connected to the bit line BL2. Further, the source of the NMOS Q1-1 and the source of the NMOS Q1-2 are formed in the same N-type diffused layer 28-3 and formed as a common region. The diffused layer 28-3 is connected to the inverted sense signal line BSAN.

Likewise, NMOSs Q2-2 and Q4-2 are formed in the element region 23. The NMOS Q2-2 is formed in a MOS-FET portion having a gate formed of a polysilicon layer 25-3 and the NMOS Q4-2 is formed in a MOSFET portion having a gate formed of a polysilicon layer 25-4. Further, the drain of the NMOS Q2-2 and the source of the NMOS Q4-2 are formed in the same N-type diffused layer 27-4 and formed as a common region. Further, the source of the NMOS Q2-1 and the source of the NMOS Q2-2 are formed in the same N-type diffused layer 27-3 and formed as a common region.

Thus, in the device in which the sense amplifier necessary for two columns is formed by use of the pattern of FIG. 4A, it is not necessary to increase the number of element regions and it is only required to fold the pattern. In other words, it is only necessary to extend the element regions 23 and 24 according to an increase in the sense amplifier. Therefore, the chip size can be reduced. Further, the reduction rate of the chip size can be further enhanced by forming a folded configuration as shown in FIG. 5 in comparison with a case wherein the pattern shown in FIG. 4A is formed in the substrate 21 for each column since it is not necessary to form an isolation region for isolating the element region.

Figure 6:
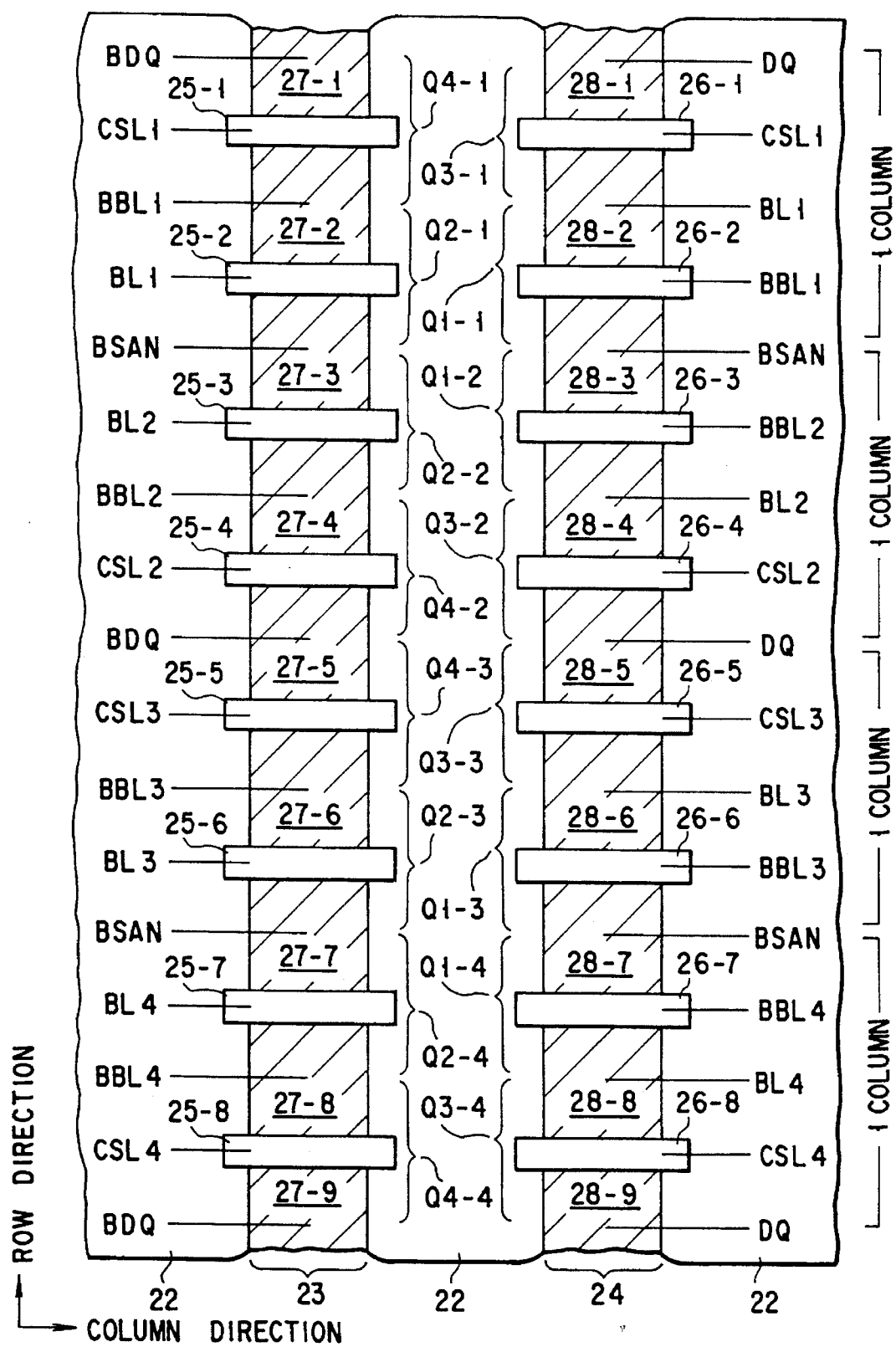
FIG. 6 is a plan view showing the layout pattern obtained when the layout pattern shown in FIG. 4A is extended for four columns.

In FIG. 6, a case wherein the layout pattern shown in FIG. 4A is extended for four columns is shown.

In a case where the pattern is extended for four columns as shown in FIG. 6, the pattern configuration can be realized by repeating the pattern for two columns shown in FIG. 5. At this time, the drain of the NMOS Q4-2 and the drain of the NMOS Q4-3 are formed in the same N-type diffused layer 27-5 and formed as a common region, and the drain of the NMOS Q3-2 and the drain of the NMOS Q3-3 are formed in the same N-type diffused layer 28-5 and formed as a common region.

Thus, even when the pattern is extended for four columns, the number of element regions is not increased like the case of the pattern extended for two columns.

Thus, in the pattern shown in FIG. 4A, even if the pattern is folded, or repeated, or folded and then repeated in the same element region so as to increase the column (bit) number of 8 columns (bits), 16 columns (bits), 32 columns (bits), - - - , sense amplifiers necessary for an increased number of columns can be obtained in the same element region.

In this invention, the number of columns is not limited to the byte unit such as 8 or 16 but can be set to various other numbers.

Next, a sense amplifier according to a second embodiment of this invention is explained.

FIG. 7 is a block diagram showing the schematic construction of a dynamic RAM to which a sense amplifier according to a second embodiment of this invention can be applied.

The dynamic RAM shown in FIG. 7 is different from the dynamic RAM of FIG. 2 in that a plurality of data line pairs such as DQ1, BDQ1 and DQ2, BDQ2 are provided and data items Dout1, Dout2 are output from the plurality of data line pairs. The configuration is generally called a multibit configuration.

Figure 8:
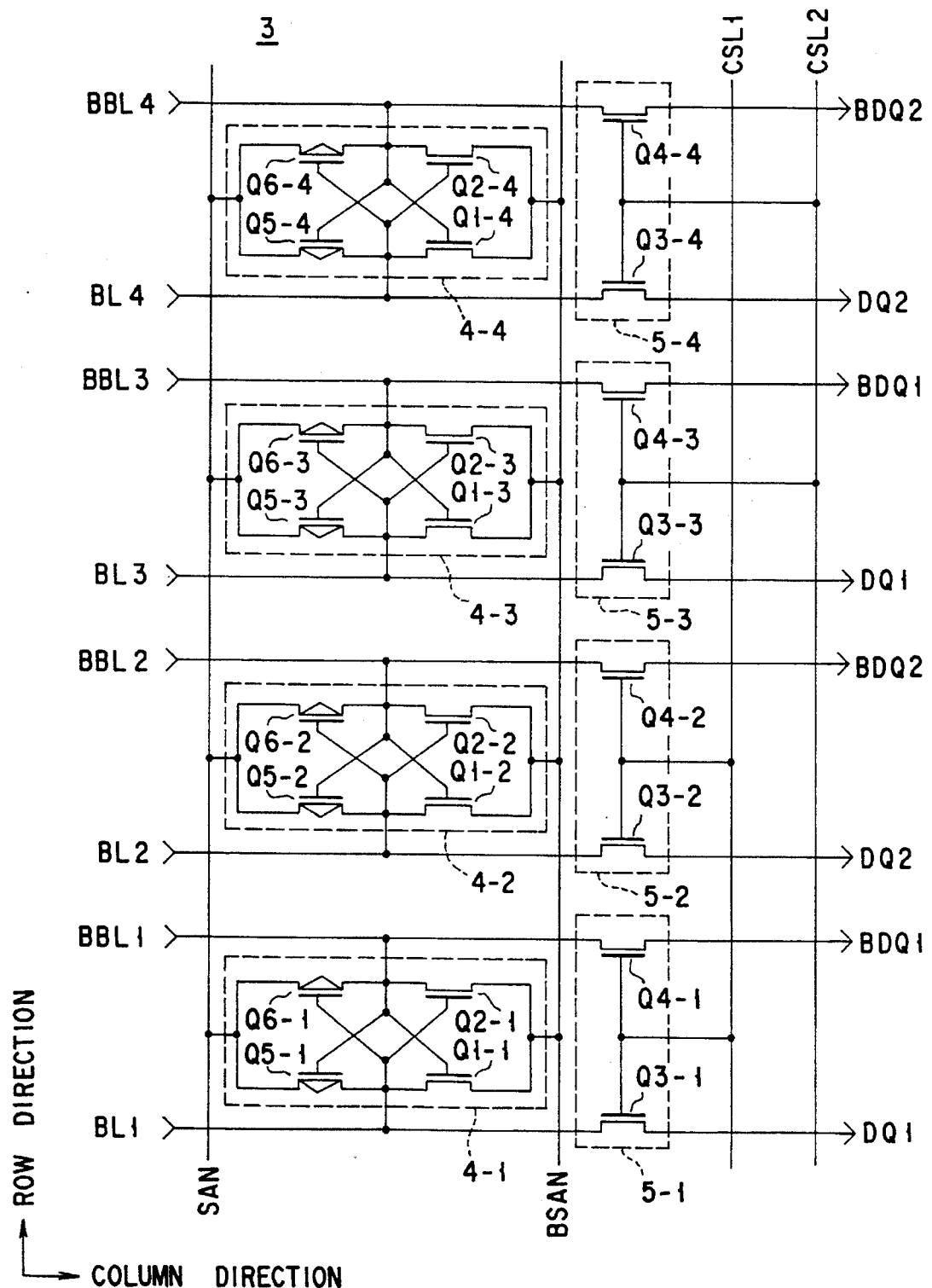
FIG. 8 is a circuit diagram of the sense amplifier shown in FIG. 7.

FIG. 8 is a circuit diagram of a sense amplifier 3 in a dynamic RAM of multibit configuration shown in FIG. 7.

As shown in FIG. 8, a column selection signal line CSL1 is connected to column gates 5-1 and 5-2. Therefore, one column selection signal can be commonly supplied to the two columns. One of the bit line pairs contained in the columns is connected to the first data line pair DQ1, BDQ1 via the column gate 5-1, and the other bit line pair is connected to the second data line pair DQ2, BDQ2 via the column gate 5-2.

Figure 9A:
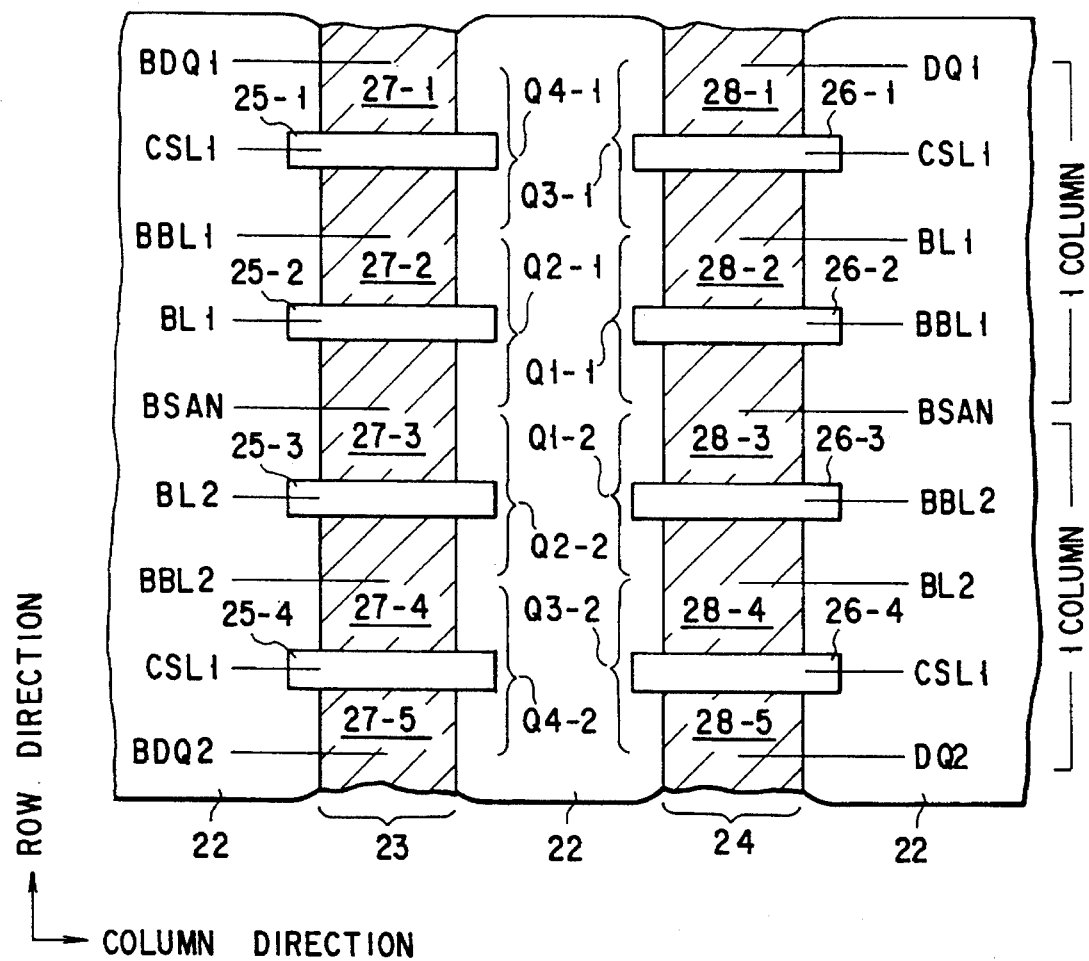
FIG. 9A is a plan view showing the layout pattern of the sense amplifier according to the second embodiment of this invention.

In the dynamic RAM of the multibit configuration having the sense amplifier 3 with the above construction, the element layout pattern of the sense amplifier 3 is made as shown in FIG. 9A in order to enhance the reduction rate of the chip size.

As shown in FIG. 9A, NMOSs Q1-1, Q1-2, Q3-1 and Q3-2 whose current paths are connected to the bit lines BL1 and BL2 are formed in one element region 24.

The NMOS Q1-1 is formed in a MOSFET portion having a gate formed of the polysilicon layer 26-2 and the NMOS Q3-1 is formed in a MOSFET portion having a gate formed of the polysilicon layer 26-1. Further, the NMOS Q1-2 is formed in a MOSFET portion having a gate formed of the polysilicon layer 26-3 and the NMOS Q3-2 is formed in a MOSFET portion having a gate formed of the polysilicon layer 26-4. The polysilicon layer 26-2 is connected to the inverted bit line BBL1 and the polysilicon layer 26-3 is connected to the inverted bit line BBL2. Further, the polysilicon layers 26-1 and 26-4 are commonly connected to the first column selection line CSL1.

The drain of the NMOS Q1-1 and the source of the NMOS Q3-1 are formed in one N-type diffused layer 28-2, the source of the NMOS Q1-1 and the source of the NMOS Q1-2 are formed in one N-type diffused layer 28-3, and the drain of the NMOS Q1-2 and the source of the NMOS Q3-2 are formed in one N-type diffused layer 28-4. The N-type diffused layer 28-2 is connected to the bit line BL1, the N-type diffused layer 28-3 is connected to the inverted sense signal line BSAN, and the N-type diffused layer 28-4 is connected to the bit line BL2.

Further, the N-type diffused layer 28-1 acting as the drain of the NMOS Q3-1 is connected to the data line DQ1 and the N-type diffused layer 28-5 acting as the drain of the NMOS Q3-2 is connected to the data line DQ2.

The NMOSs Q2-1, and Q4-1, and Q2-2 and Q4-2 whose current paths respectively are connected to the inverted bit lines BBL1 and BBL2 are formed in one element region 23.

The NMOS Q2-1 is formed in a MOSFET portion having a gate formed of the polysilicon layer 25-2 and the NMOS Q4-1 is formed in a MOSFET portion having a gate formed of the polysilicon layer 25-1. Further, the NMOS Q2-2 is formed in a MOSFET portion having a gate formed of the polysilicon layer 25-3 and the NMOS Q4-2 is formed in a MOSFET portion having a gate formed of the polysilicon layer 25-4. The polysilicon layer 25-2 is connected to the bit line BL1 and the polysilicon layer 25-3 is connected to the bit line BL2. Further, the polysilicon layers 25-1 and 25-4 are commonly connected to the first column selection line CSL1.

The drain of the NMOS Q2-1 and the source of the NMOS Q4-1 are formed in one N-type diffused layer 27-2, the source of the NMOS Q2-1 and the source of the NMOS Q2-2 are formed in one N-type diffused layer 27-3, and the drain of the NMOS Q2-2 and the source of the NMOS Q4-2 are formed in one N-type diffused layer 27-4. The N-type diffused layer 27-2 is connected to the inverted bit line BBL1, the N-type diffused layer 27-3 is connected to the inverted sense signal line BSAN, and the N-type diffused layer 27-4 is connected to the inverted bit line BBL2.

Further, the N-type diffused layer 27-1 acting as the drain of the NMOS Q4-1 is connected to the inverted data line BDQ1 and the N-type diffused layer 27-5 acting as the drain of the NMOS Q4-2 is connected to the inverted data line BDQ2.

Figure 9B:
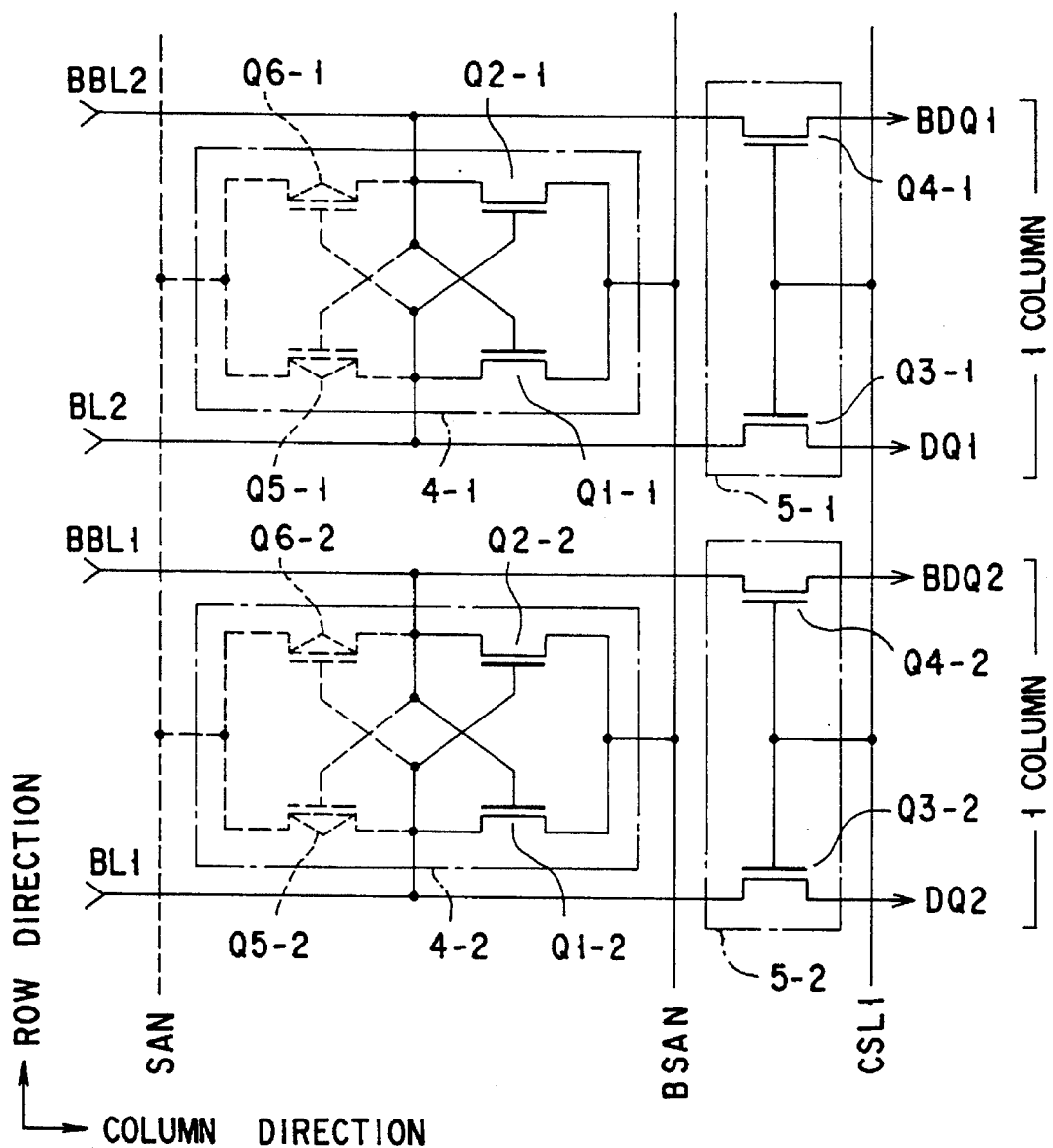
FIG. 9B is an equivalent circuit diagram of the sense amplifier shown in FIG. 9A.

FIG. 9B is an equivalent circuit diagram of the layout pattern shown in FIG. 9A.

In FIG. 9B, a circuit portion having interconnections indicated by solid lines indicates the pattern portion shown in FIG. 9A. Further, a circuit portion having interconnections indicated by broken lines indicates a portion constructed by PMOSs and the pattern thereof is not shown.

Figure 10:
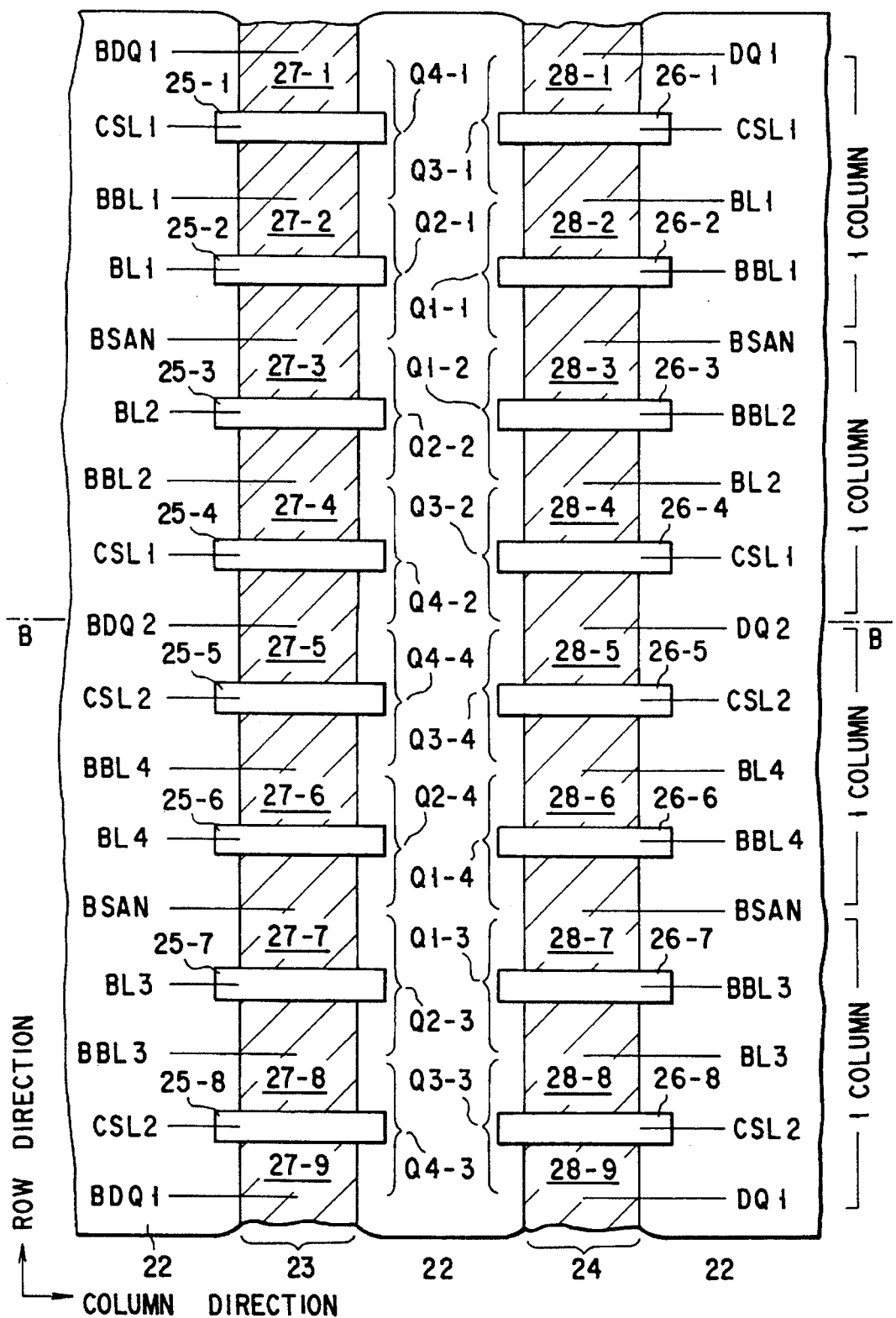
FIG. 10 is a plan view showing the layout pattern obtained when the layout pattern shown in FIG. 9A is extended for four columns.

An example in which the layout pattern with the above construction is extended for four columns (four bits) is shown in FIG. 10.

As shown in FIG. 10, like the case of the first embodiment, when the pattern is extended for four columns, basically, it is only required to fold the layout pattern shown in FIG. 9A along the portion of the diffused layers 27-5 and 28-5, that is, along the B—B line in FIG. 10.

Further, although not shown in the drawing, when the pattern is extended for eight columns, the pattern can be attained by repeating the pattern shown in FIG. 10.

Next, a preferable pattern obtained in a case where a sense amplifier according to this invention is formed in an integrated circuit form is explained as a third embodiment. The explanation for the third embodiment is made by taking a case where this invention is applied to the device of multibit configuration explained in the second embodiment as an example.

Figure 11A:
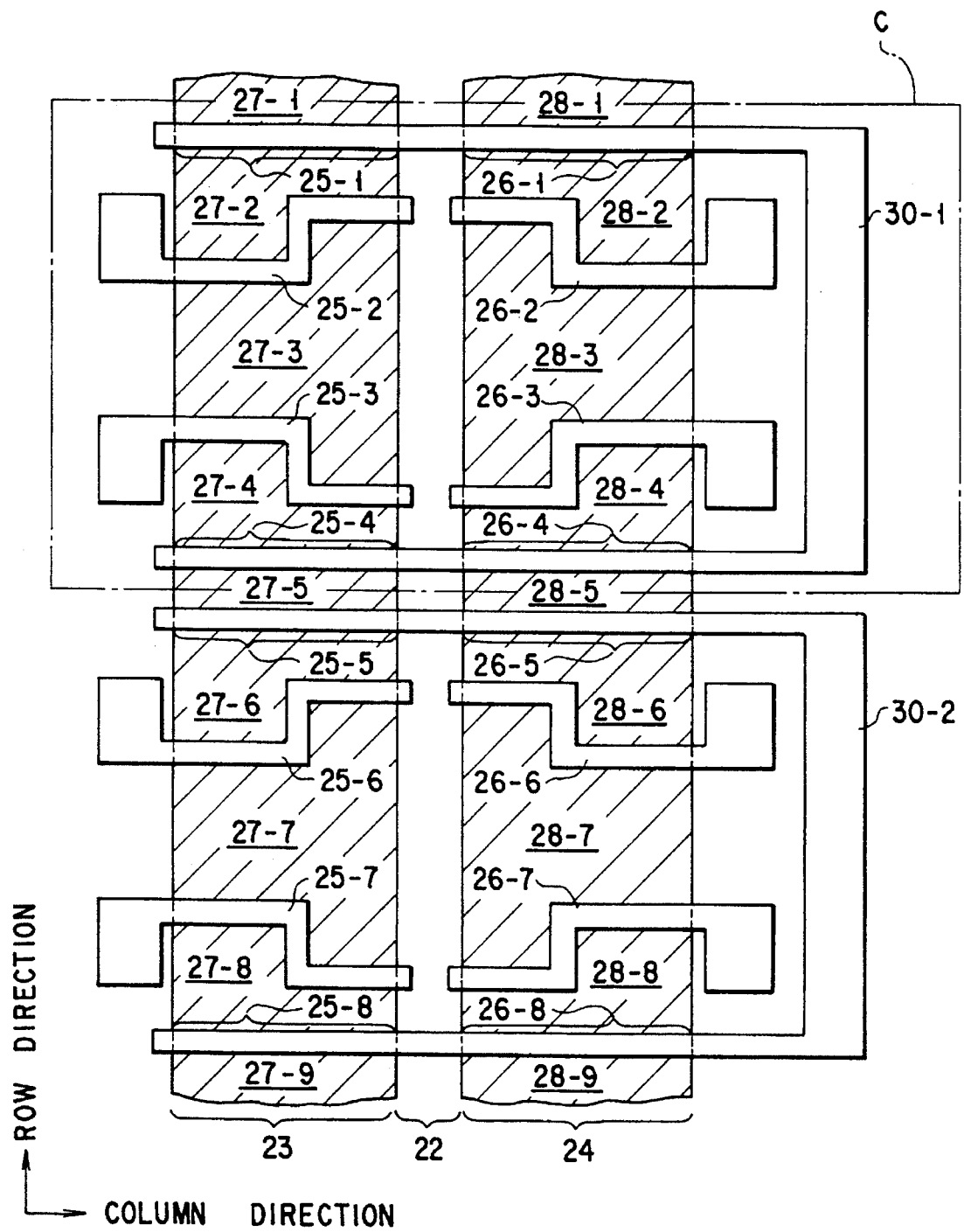
FIG. 11A is a plan view showing the gate pattern of a sense amplifier according to a third embodiment of this invention.
Figure 11B:
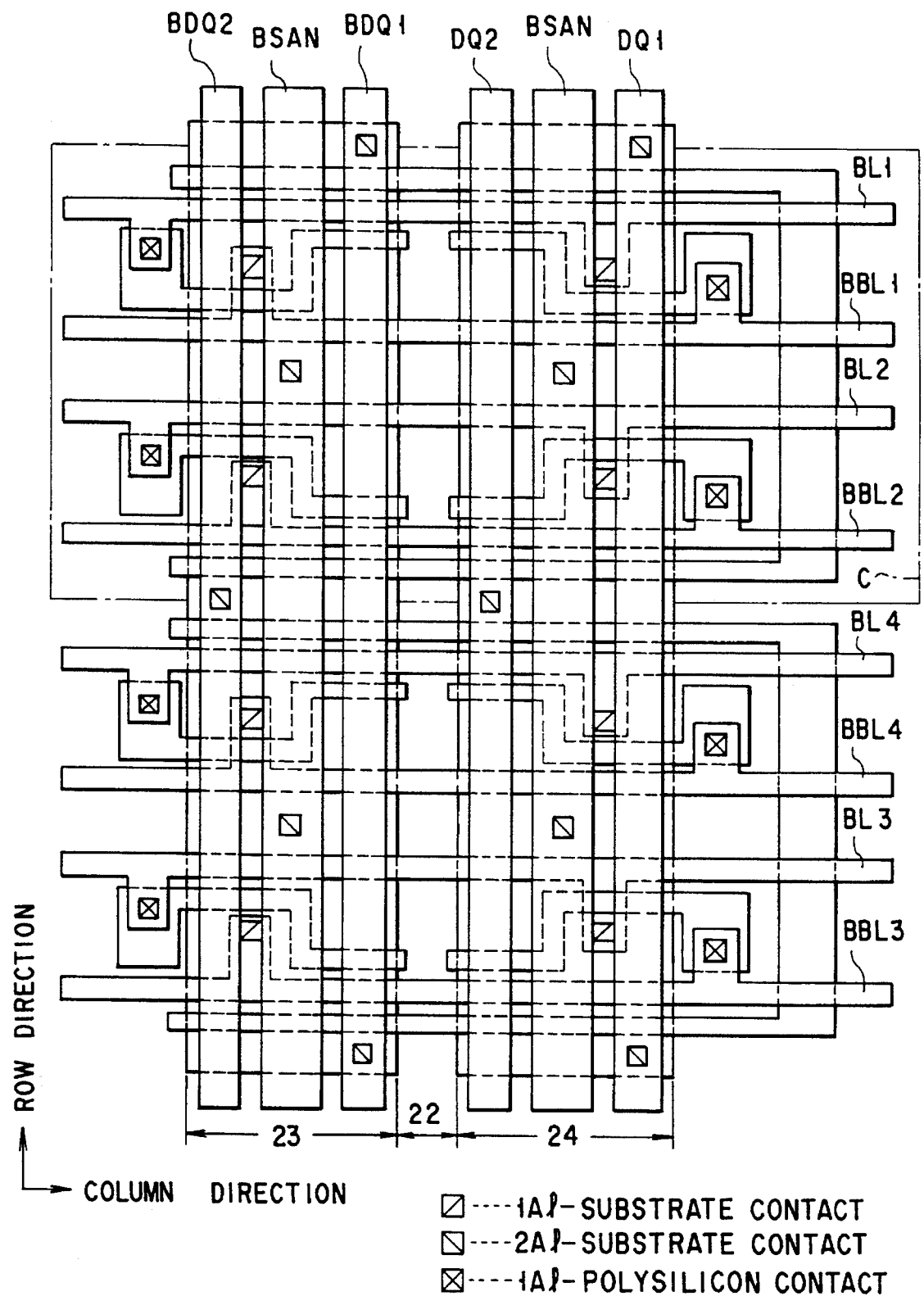
FIG. 11B is a plan view showing a state in which an internal connection interconnection layer is formed on the pattern shown in FIG. 11A.
Figure 11C:
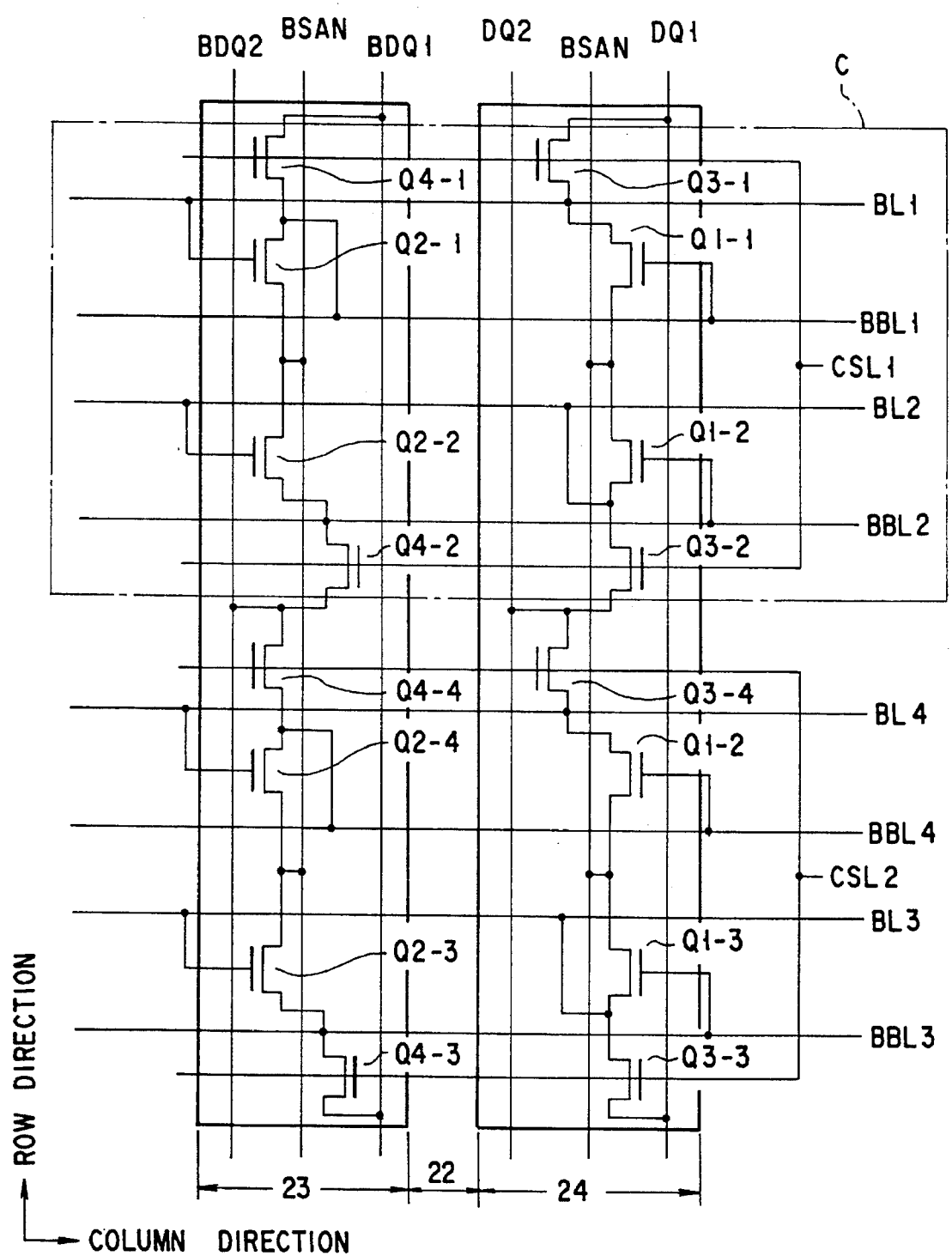
FIG. 11C is an equivalent circuit diagram of the sense amplifier shown in FIGS. 11A and 11B.

FIG. 11A is a plan view showing the gate pattern of a sense amplifier according to a third embodiment of this invention, FIG. 11B is a plan view showing a state in which an internal connection interconnection layer is formed on the pattern shown in FIG. 11A, and FIG. 11C is an equivalent circuit diagram thereof.

As shown in FIG. 11A, element regions 23 and 24 are formed in a silicon substrate and isolated from each other by an element isolation region 22. The element regions 23 and 24 are formed in parallel to each other.

Polysilicon layers 25-1, 25-4, 26-1 and 26-4 to which a first column selection line CSL1 is connected are integrally formed of one polysilicon layer 30-1. Further, polysilicon layers 25-5, 25-8, 26-5 and 26-8 to which a second column selection line CSL2 is connected are integrally formed of one polysilicon layer 30-2. Those portions of the polysilicon layers 30-1 and 30-2 which face each other are formed on straight lines and disposed close to each other. The other polysilicon layers are bent in the same plane along the channel length direction (the channel length direction in this embodiment corresponds to the row direction) on the way of the element region 23 or 24.

Further, as shown in FIG. 11B, bit lines BL1 to BL4 and inverted bit lines BBL1 to BBL4 are formed of a first-level aluminum layer (1A1), for example, along the channel width direction (the channel width direction in this embodiment corresponds to the column direction) of NMOSs. Data lines DQ1, DQ2 and inverted data lines BDQ1, BDQ2 are arranged on the element regions 23 and 24 and formed of a second-level aluminum layer (2A1) along the channel length direction of the NMOSs.

A frame C indicated by one-dot-dash lines in FIGS. 11A to 11C indicates a portion corresponding to the pattern shown in FIG. 9A.

In the sense amplifier with the above construction, the number of contact holes can be reduced by integrally forming polysilicon layers (gates) which are commonly connected to the column selection signal line by use of a single polysilicon layer.

Further, the gate width of the NMOS can be extended and the current conducting ability can be enhanced by bending the polysilicon layers (gates) in the channel length direction on the element region.

Further, as is well shown in FIGS. 11B and 11C, NMOSs, for example, NMOSs Q1-1 and Q2-1 which are connected to a pair of bit lines BL and BBL can be disposed between the pair of bit lines by arranging the element regions 23 and 24 in parallel to each other. The pattern in which the element regions 23 and 24 are arranged in parallel to each other is particularly effective for a device of folded bit line configuration in which the bit lines BL and BBL are arranged close to each other in the memory cell array.

Further, those portions of the polysilicon layers 30-1 and 30-2 which face each other are formed on straight lines and disposed close to each other. This means that data line contact holes can be formed in self-alignment with the polysilicon layers 30-1 and 30-2. That is, after a thick silicon oxide film is formed on the polysilicon layer, a film formed of material which has a certain selective etching ratio with respect to the silicon oxide film, for example, a silicon nitride film is formed. When the three-layered structure is formed, the patterning process is effected so as to obtain a pattern of the polysilicon layers 30-1 and 30-2 on which an insulation layer containing the silicon nitride film is formed. After this, a side wall spacer is formed on the side walls of the above layers. The side wall spacer also contains the silicon nitride film.

Figure 12:
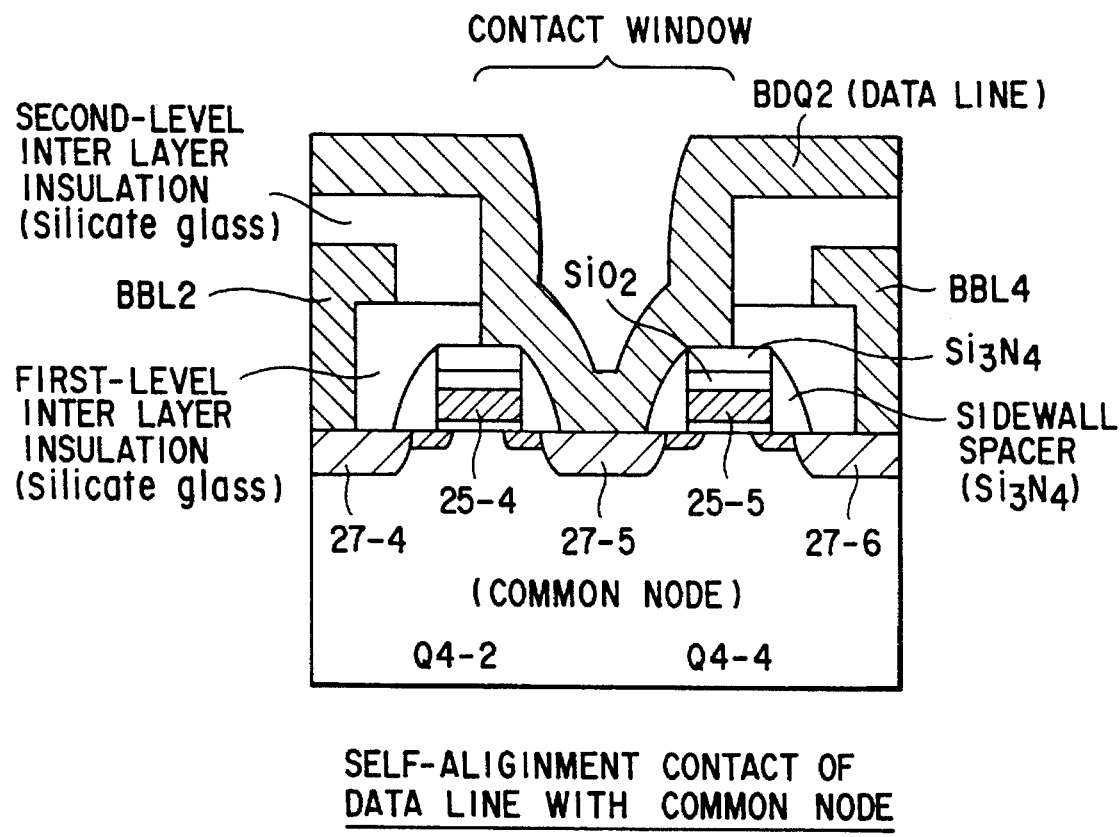
FIG. 12 is a cross sectional view of a portion in which a self-alignment contact is used.

Thus, the peripheral portions of the polysilicon layers 30-1 and 30-2 are covered with an insulation layer containing a nitride film acting as an etching barrier. With this structure, the polysilicon layers 30-1 and 30-2 can be protected by the etching barrier and will not be etched even when the opening of the contact hole lies over both of the polysilicon layers 30-1 and 30-2. Therefore, contact holes can be formed to lie over the polysilicon layers 30-1 and 30-2 and this structure is preferable to enhance the integration density. The above contact technique is called a self-alignment contact. The cross section obtained when the self-alignment contact is used for connection between the data line DQ and a common node of the column gates is shown in FIG. 12. The cross section shown in FIG. 12 shows a connection portion between the diffused layer 27-5 and the data line BDQ2, but any portion in the 2A1 substrate contact portion shown in FIG. 11B can be used.

Next, a sense amplifier according to a fourth embodiment of this invention is explained.

The fourth embodiment is explained by taking the device of multibit configuration explained in the second embodiment as an example. The explanation is made with respect to the second column.

Figure 13:
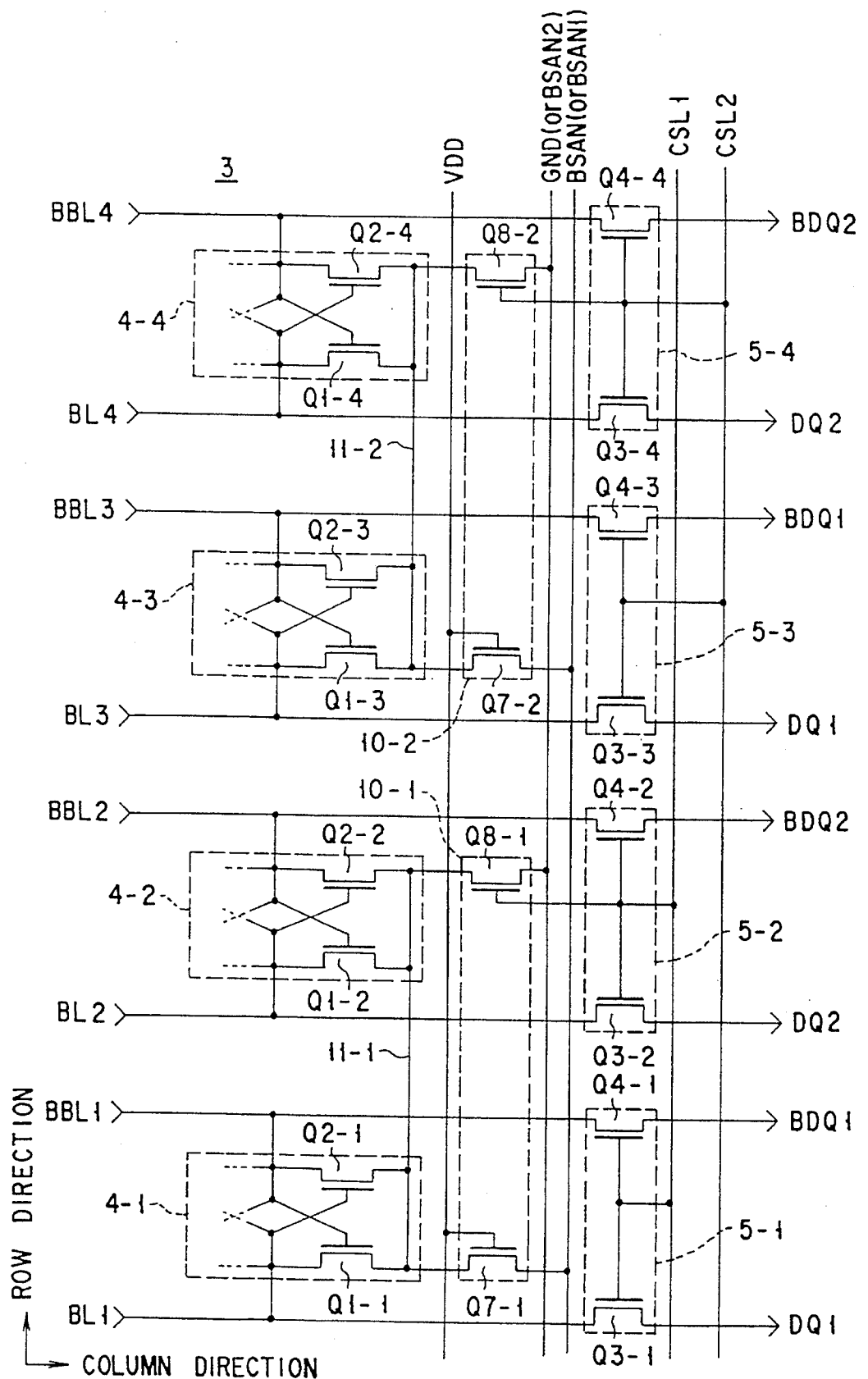
FIG. 13 is a circuit diagram of a sense amplifier according to a fourth embodiment of this invention.

FIG. 13 is a circuit diagram of the sense amplifier according to the fourth embodiment of this invention.

As shown in FIG. 13, a common node (common source) 11-1 of sense circuits 4-1 and 4-2 is connected to an inverted sense signal line BSAN which is a power supply of the sense circuits 4-1 to 4-4 and a ground line GND fixed at the ground potential via a sense amplifier selection activating circuit 10-1. The sense amplifier selection activating circuit 10-1 selects and activates one of the plurality of sense circuits, or a pair of sense circuits which are made as a pair by the column selection signal CSL as shown in FIG. 13. The sense amplifier selection activating circuit 10-1 explained in this embodiment includes an NMOS Q7-1 and an NMOS Q8-1.

One end of the current path of the NMOS Q7-1 is connected to the common node 11-1. The common node 11-1 is a common node of the common sources of NMOSs Q1-1 and Q2-1 of the sense circuit 4-1 and the common sources of NMOSs Q1-2 and Q2-2 of the sense circuit 4-2. Further, the other end of the NMOS Q7-1 is connected to an inverted sense signal line BSAN and the gate thereof is connected to a high potential power supply line VDD. The NMOS Q7-1 is kept in the ON state while a high potential VDD is applied to the sense amplifier selection activating circuit 10-1 since the gate thereof is connected to the high potential power supply line VDD.

One end of the current path of the NMOS Q8-1 is connected to the common node 11-1 and the other end of the current path thereof is connected to the ground line GND. Further, the gate of the NMOS is connected to the column selection line CSL1 and the NMOS Q8-1 is set in the ON state only while the potential of the column selection line CSL1 is set at the "H" level.

In the sense circuit 3 having the selection activating circuit 10-1, the common node 11 is supplied with the power supply via the two transistors, that is, the NMOS Q7-1 and the NMOS Q8-1 which is connected in parallel to the NMOS Q7-1 only when the column is selected by the column selection signal CSL. That is, since the power supply voltage is supplied at high speed to the sense circuits 4-1 and 4-2, the access time of the memory can be reduced. In addition, the access time of the memory can be reduced without increasing the power consumption.

Further, as shown in FIG. 13, the inverted sense signal line can be replaced by BSAN1 and the ground line GND can be replaced by BSAN2.

Figure 14A:
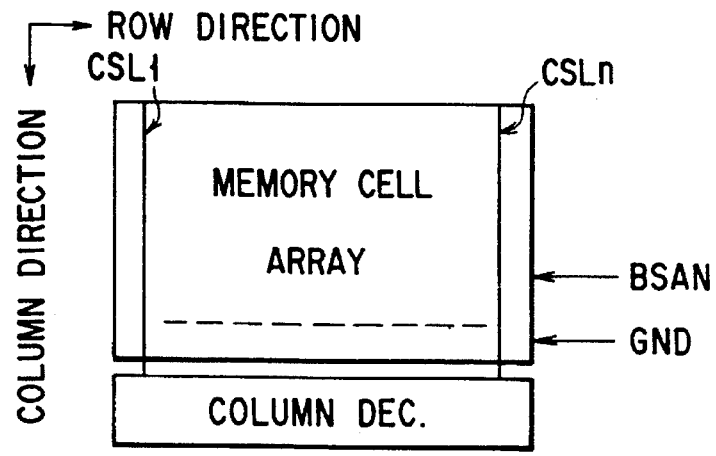
FIG. 14A is a schematic block diagram showing the construction of a memory cell array.

FIG. 14A is a block diagram showing a semiconductor memory device having one memory cell array attached to one column decoder.

When the construction shown in FIG. 14A is used as the construction of the memory array, it is desirable to use the sense amplifier activating signal BSAN and ground potential GND.

Figure 14B:
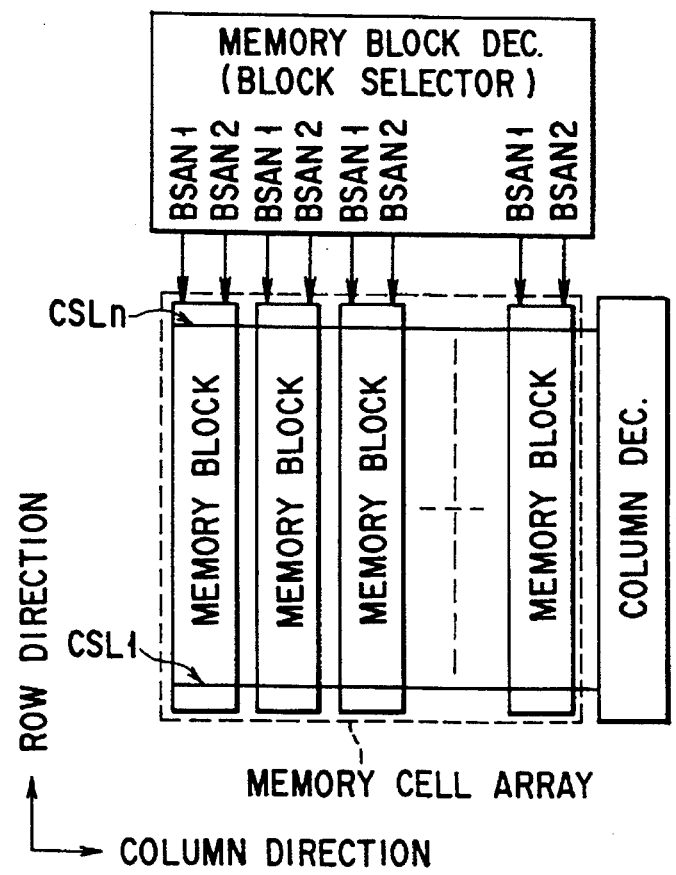
FIG. 14B is a schematic block diagram showing the construction of another memory cell array.

Further, FIG. 14B is a block diagram showing a semiconductor memory device in which one memory cell array is attached to one column decoder and the memory cell array is divided into block units for every preset number of rows. This type of memory cell array is often provided in DRAMs of very-large-scale capacity (for example, 16M, 64M).

When the construction shown in FIG. 14B is used as the construction of the memory array, it is desirable to respectively replace the inverted sense signal line BSAN and ground line GND by a signal BSAN1 for simultaneously activating all of the sense amplifiers of the selected memory block and a signal BSAN2 for activating the sense amplifiers of the selected memory block, selected by column select signal (CSL).

Figure 15A:
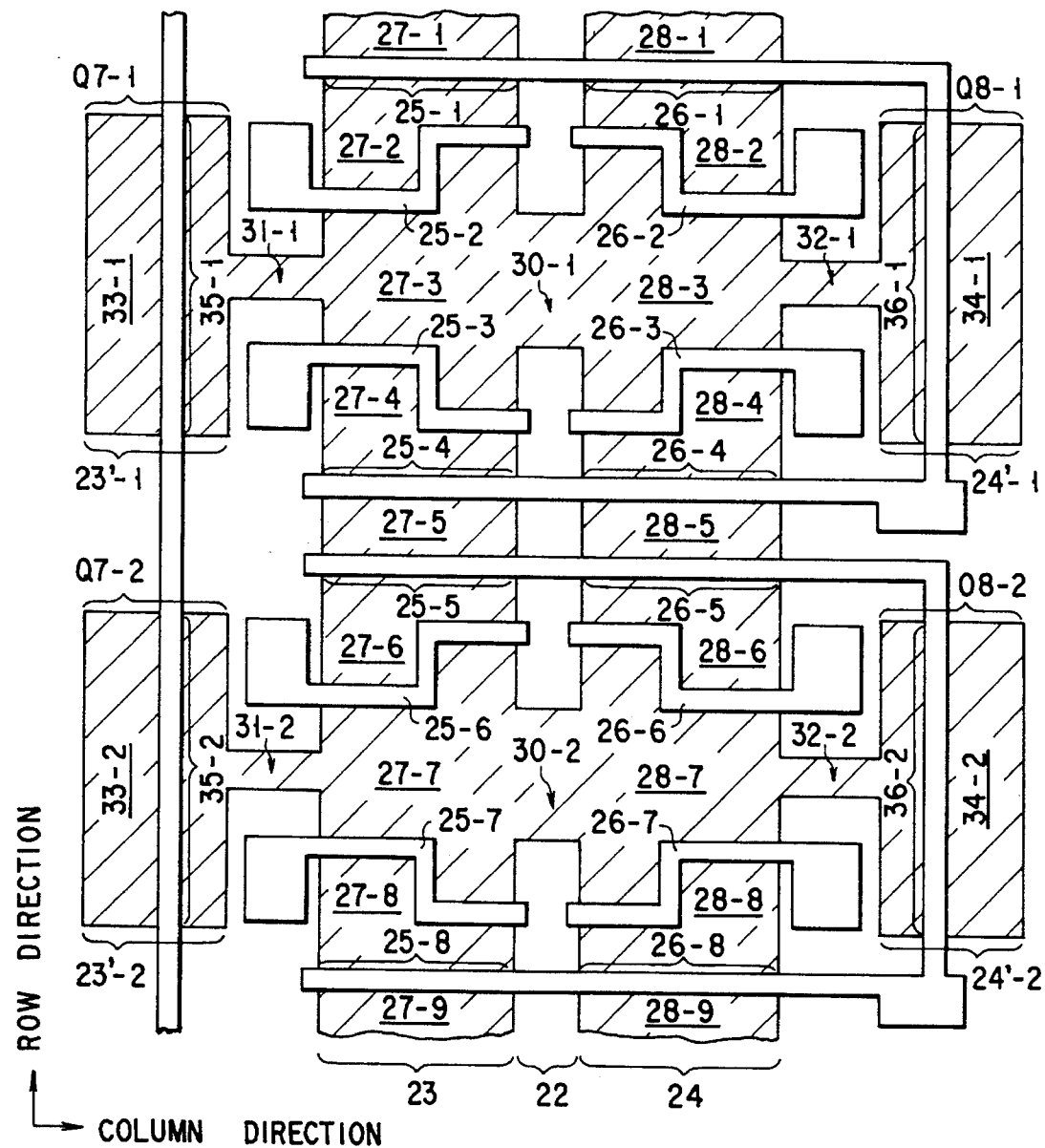
FIG. 15A is a plan view showing a gate pattern of the sense amplifier according to the fourth embodiment of this invention.
Figure 15B:
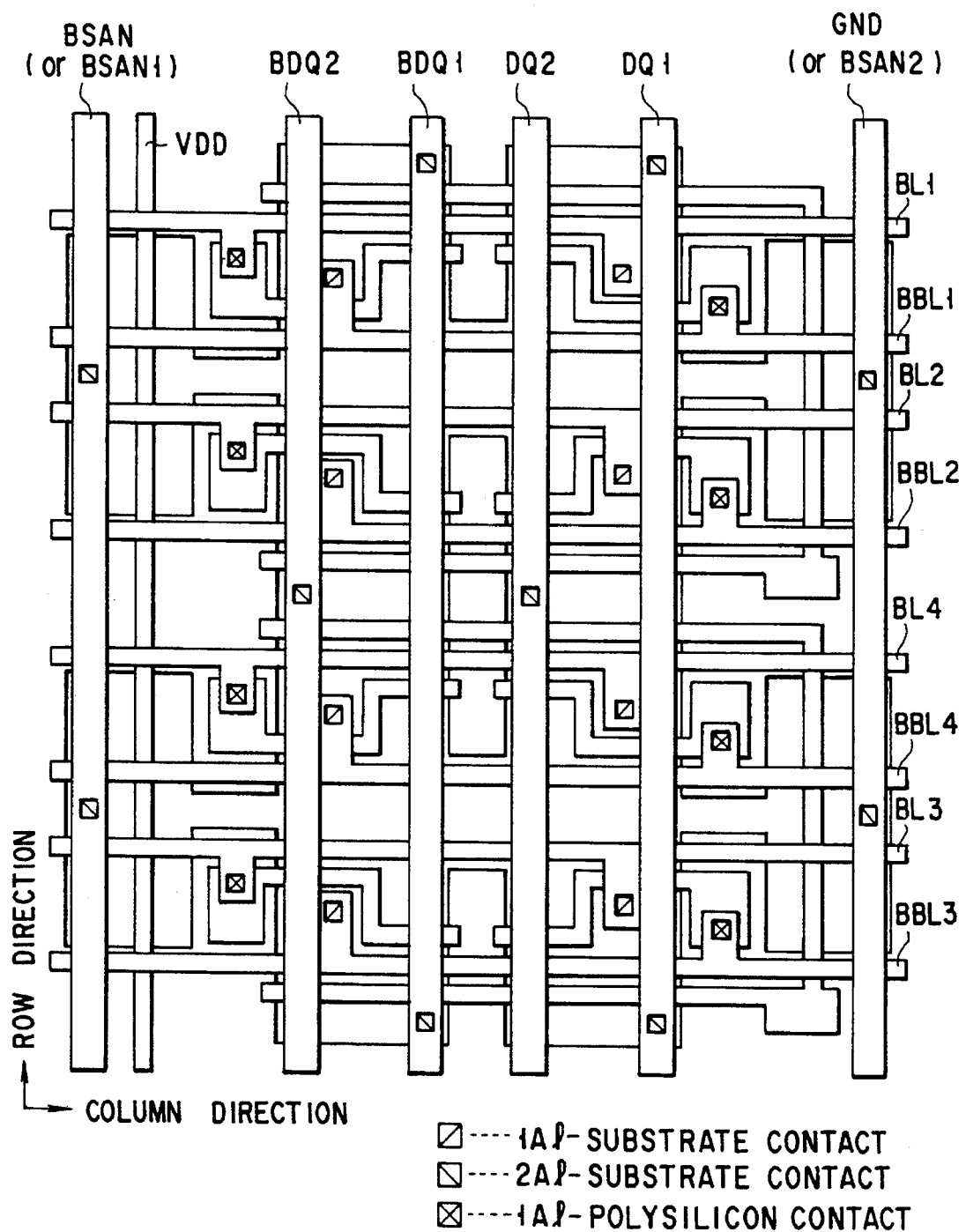
FIG. 15B is a plan view showing a state in which an internal connection interconnection layer is formed on the pattern shown in FIG. 14A.

In the dynamic RAM having the sense amplifier 3 with the construction shown in FIG. 3, the element pattern of the sense amplifier 3 is formed with the configuration shown in FIGS. 15A and 15B to further enhance the integration density.

FIG. 15A is a plan view showing the gate pattern of the sense amplifier according to the third embodiment, FIG. 15B is a plan view showing a state in which an internal connection interconnection layer is formed on the pattern shown in FIG. 15A, and FIG. 15C is an equivalent circuit diagram thereof.

The pattern shown in FIGS. 15A and 15B is of the same type as the pattern shown in FIGS. 11A and 11B. The significant difference between them is that NMOSs Q7-1, Q8-1, Q7-2, Q8-2 of the selection activating circuits 10-1 and 10-2 are connected to the common sources of the sense circuits, that is, the common nodes 11-1, 11-2 shown in FIG. 13.

As shown in FIGS. 15A to 15C, the pattern of the common node 11-1 is formed with the following configuration. First, an N-type diffused layer 27-3 which is a common node of the NMOSs Q2-1 and Q2-2 is integrally coupled with an N-type diffused layer 28-3 which is a common node of the NMOSs Q1-1 and Q1-2 via an N-type diffused layer 30-1 obtained by newly forming an element region. Likewise, the N-type diffused layer 27-3 is integrally coupled with an element region 23'-1 which is formed adjacent to the element region 23 in the column direction to form the NMOS, Q7-1 via an N-type diffused layer 31-1. Further, the N-type diffused layer 28-3 is integrally coupled with an element region 24'-1 which is formed adjacent to the element region 23 in the column direction to form the NMOS, Q8-1 via an N-type diffused layer 32-1.

Further, as shown in FIGS. 15A to 15C, the pattern of the common node 11-2 is formed with the same configuration as the pattern of the common node 11-1 although transistors to be connected thereto are different.

In FIG. 15A, an area denoted by the reference numeral 33-1 is the source of the NMOS Q7-1, an area denoted by the reference numeral 33-2 is the source of the NMOS Q7-2, an area denoted by the reference numeral 34-1 is the source of the NMOS Q8-1, and an area denoted 10 by the reference numeral 34-2 is the source of the NMOS Q8-2.

Further, members denoted by the reference numerals 35-1, 35-2 are the gates of the NMOSs Q7-1, Q7-2, and members denoted by the reference numerals 36-1, 36-2 are the gates of the NMOSs Q8-1, Q8-2.

Next, the relation between the memory cell array and the element regions 23, 24 of the sense amplifier according to this invention is explained.

In the sense amplifiers explained in the above first to fourth embodiments, the NMOS contained in the sense circuit and connected to the bit line BL and the NMOS contained in the column gate and connected to the bit line BL are formed in the same element region so that even when the number of columns is increased, a portion of a sense amplifier required to cope with an increase in the number of columns, particularly, an NMOS circuit portion thereof can be permanently integrated and formed in one element region. This is shown in the drawing in a simple form.

FIG. 16A is a diagram showing the relation between the memory cell array and the element region.

As shown in FIG. 16A, when a memory cell array (or memory block) having 256 columns integrated therein is formed in a chip, a sense amplifier according to this invention is arranged in a linear area (sense amplifier array) 100 formed along the row direction of the memory cell array (or the memory block). Further, the element regions 23 and 24 can be formed in one pattern from one end of the memory cell array (or the memory block) to the other end thereof in the area 100. Of course, even if 512 columns, 1024 columns or more columns are used, the above-described relation is unchanged.

The reason why two element regions are formed is that the bit lines and data lines are generally used in a paired form, and in a device in which bit lines and data lines are used in a single form instead of the paired form, it is sufficient if one of the element regions 23 and 24 is formed.

Further, even if the device uses paired lines, the number of element regions required for one column can be suppressed to two while it is necessary to form four element regions in the prior art. In this type of device, as the column number is increased, the number of element regions is inevitably increased to form sense amplifiers which are required to cope with the increase in the number of columns, but according to the sense amplifier described in the above embodiment, formation of two element regions is always sufficient even if the number of columns is increased.

Further, this invention can be modified as follows.

Figure 16B:
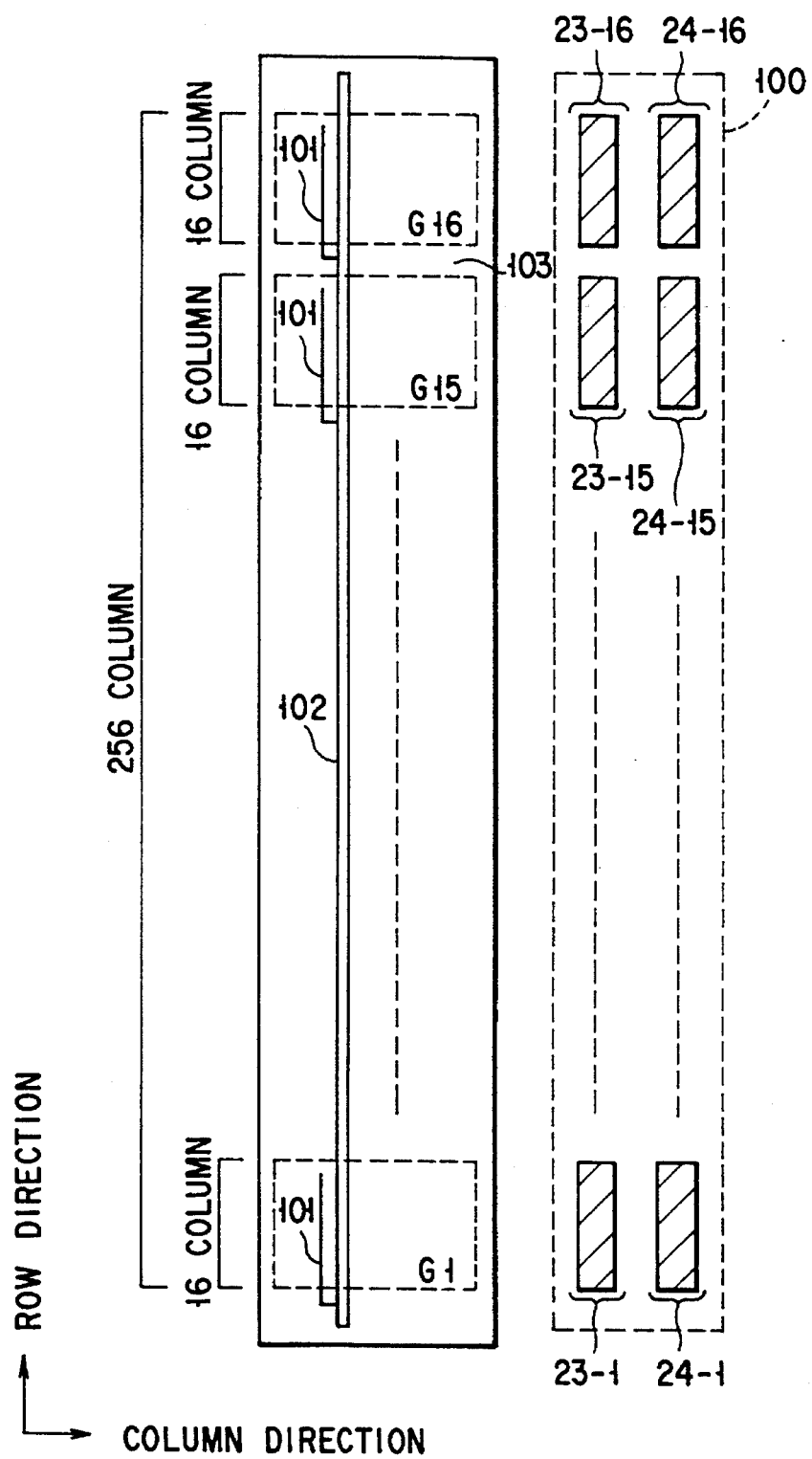
FIG. 16B is a plan view showing the element region pattern and another memory cell array of a sense amplifier according to this invention.

FIG. 16B is a diagram showing the relation between the memory cell array having another construction and the element region.

In some semiconductor memories such as DRAMs, the memory cell array (or memory block) is divided into groups for every preset number of columns.

In FIG. 16B, this type of memory cell array is shown, 256 columns are divided for every 16 columns, and a total of 16 memory groups G1 to G16 are provided. In general, a memory having memory groups has small word lines 101— independently provided for each group and a large word line 102 connected to the small word lines 101—.

In this type of memory, an area 103 is used for connecting the small word lines 101 and large word line 102 between the memory groups. In this area 103, no memory cell is present, and therefore, no bit line is formed. Since no bit line is formed, a diffused layer formed in the element regions 23 and 24 in the area 103 portion becomes longer in the row direction than a portion in which bit lines are formed if the element regions 23 and 24 are formed in a single pattern as shown in FIG. 16A. For this reason, the parasitic capacitance between the diffused layer and the substrate becomes unbalanced. If the parasitic capacitance becomes unbalanced, a variation in the access time between the memory cells may become significant.

Therefore, in the device in which the memory cell array (or memory block) is divided into groups for every preset number of columns, it is preferable to divide the element regions 23 and 24 into element regions 23-1 to 23-16 and 24-1 to 24-16 for respective memory groups G1 to G16. With this construction, an unbalance in the parasitic capacitance can be prevented and a variation in the access time between the memory cells can be reduced.

As described above, according to this invention, it is possible to provide a sense amplifier in which an area used for isolating transistors constructing the sense amplifier from each other can be reduced and the chip size can be reduced.

More, the effect becomes further significant as the number of columns is increased, that is, the capacity of the semiconductor memory device becomes larger.

The element isolation region is an ineffective region (dead region) which does not function as a device in the chip, but according to this invention, the ineffective region can be reduced, and therefore, the efficiency of usage of the chip can be enhanced.

Figure 17:
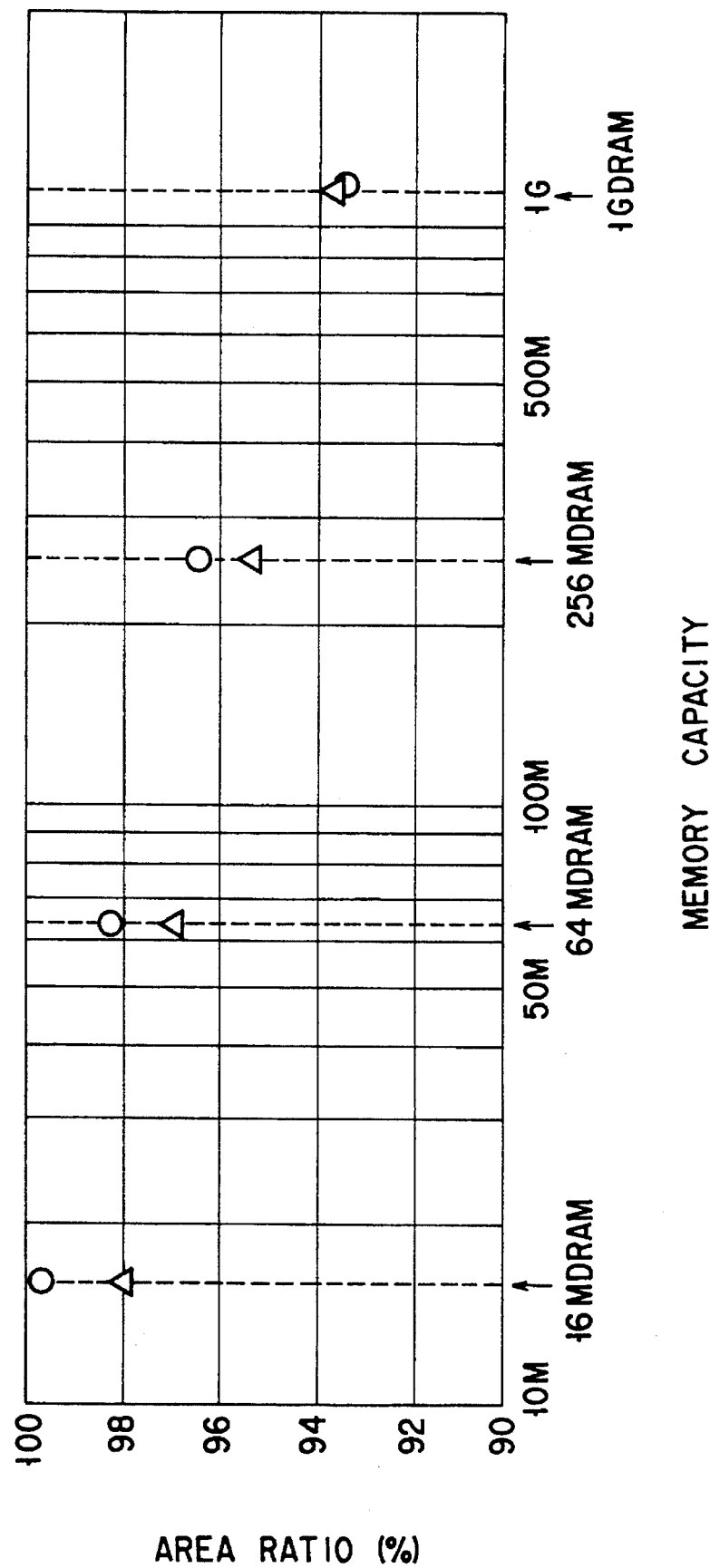
FIG. 17 is a diagram showing the relation between the memory capacity and the reduction rate of a sense amplifier.

FIG. 17 is a diagram showing the effect of reduction in the sense amplifier array by use of the sense amplifier according to this invention.

When the area of a sense amplifier array constructed by typical sense amplifiers is set to 100%, the area of a sense amplifier array constructed by sense amplifiers according to this invention is expected to be 98% in a 16M DRAM, 97% in a 64M DRAM, 95.6% in a 256M DRAM, and 93.8% in a 1 G DRAM (indicated by triangular marks in the drawing).

Thus, with the sense amplifier according to this invention, the area of the sense amplifier array is stably reduced as the scale of the memory capacity is increased.

Further, when the occupied area of a sense amplifier array constructed by typical sense amplifiers in a chip is set to 100%, the occupied area of a sense amplifier array constructed by sense amplifiers according to this invention is expected to be 99.2% in a 16M DRAM, 98.4% in a 64M DRAM, 96.7% in a 256M DRAM, and 93.4% in a 1 G DRAM (indicated by circular marks in the drawing).

Thus, with the sense amplifier according to this invention, the occupied area of the sense amplifier array in the chip is stably reduced as the scale of the memory capacity is increased.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A sense amplifier comprising:

a column gate including a first group of circuit elements; and a sense circuit including a second group of circuit elements, wherein the circuit elements of said first and second groups are integrated together in the same pattern.

2. A sense amplifier according to claim 1, wherein said column gate includes at least a first transistor provided in an element region of a semiconductor substrate; and said sense circuit includes at least a second transistor provided in said element region and having a common node with said first transistor.

3. A sense amplifier according to claim 2, wherein said first transistor includes a first semiconductor region provided in said element region, a second semiconductor region provided in said element region, and a first gate electrode provided above a portion of said element region which lies between said first semiconductor region and said second semiconductor region; and said second transistor includes said second semiconductor region which is the common node with respect to said first transistor, a third semiconductor region provided in said element region, and a second gate electrode provided above a portion of said element region which lies between said second semiconductor region and said third semiconductor region.

4. A sense amplifier according to claim 3, wherein said first semiconductor region is connected to a data line; said second semiconductor region is connected to a bit line; said first gate electrode is connected to a column selection line; said third semiconductor region is connected to a sense amplifier power supply line; and said second gate electrode is connected to a reference potential line for sense amplification.

5. A sense amplifier according to claim 4, wherein said sense amplifier power supply line is a sense amplifier activating signal line and said reference potential line for sense amplification is another bit line which forms a bit line pair with said second bit line.

6. A sense amplifier according to claim 5, wherein said element region is provided in a linear form when viewed in a plan view.

7. A sense amplifier according to claim 6, wherein said linear element region intersects said bit line at right angles.

8. A sense amplifier according to claim 7, wherein said first gate electrode and said second gate electrode are parallel to said bit line and disposed above said element region.

9. A sense amplifier according to claim 8, wherein said second gate electrode has at least one portion which is bent in a direction perpendicular to said bit line above said element region.

10. A sense amplifier according to claim 9, wherein said data line is provided in a layer different from a layer in which said bit line is provided and intersects said bit line at right angles.

11. A sense amplifier according to claim 10, wherein said data line is connected to said first semiconductor region via a self-alignment contact.

12. A sense amplifier according to claim 1, further comprising a sense amplifier selection activating circuit including a third group of circuit elements, wherein the circuit elements of said second and third groups are integrated together in the layout pattern, for selecting and activating said sense circuit.

13. A sense amplifier according to claim 12, wherein said column gate includes at least a first transistor provided in an element region of a semiconductor substrate; said sense circuit includes at least a second transistor provided in said element region and having a common node with said first transistor, and said sense amplifier selection activating circuit includes at least a third transistor provided in said element region and having a common node with said second transistor.

14. A sense amplifier according to claim 13, wherein said first transistor includes a first semiconductor region provided in said element region, a second semiconductor region provided in said element region, and a first gate electrode provided above a portion of said element region which lies between said first semiconductor region and said second semiconductor region; said second transistor includes said second semiconductor region which is the common node with respect to said first transistor, a third semiconductor region provided in said element region, and a second gate electrode provided above a portion of said element region which lies between said second semiconductor region and said third semiconductor region; and said third transistor includes said third semiconductor region which is the common node with respect to said second transistor, a fourth semiconductor region provided in a different element region integrally provided with said element region, and a third gate electrode provided above a portion of said different element region which lies between said third semiconductor region and said fourth semiconductor region.

15. A sense amplifier according to claim 14, wherein said first semiconductor region is connected to a data line; said second semiconductor region is connected to a bit line; said first gate electrode is connected to a column selection line; said second gate electrode is connected to a reference potential line for sense amplification; said fourth semiconductor region is connected to a sense amplifier power supply line; said third gate electrode is connected to said column selection line.

16. A sense amplifier according to claim 15, wherein said sense amplifier power supply line is selected from the group consisting of a ground line and a sense amplifier activating signal line, and said reference potential line for sense amplification is another bit line which forms a bit line pair with said bit line.

17. A sense amplifier according to claim 16, wherein said first semiconductor region, second semiconductor region and third semiconductor region are arranged in a first direction when viewed in a plan view, and said fourth semiconductor region is arranged in a second direction perpendicular to said first direction and adjacent to said third semiconductor region.

18. A sense amplifier according to claim 17, wherein said first direction is perpendicular to said bit line and said second direction is parallel to said bit line.

19. A sense amplifier according to claim 18, wherein said first gate electrode and said second gate electrode are provided above said element region parallel to said bit line, and said third gate electrode is provided in a direction perpendicular to said bit line above said element region.

20. A sense amplifier according to claim 19, wherein said second gate electrode has at least one portion which is bent in a direction perpendicular to said bit line above said element region.

21. A sense amplifier according to claim 20, wherein said data line is provided in a layer different from a layer in which said bit line is provided and intersects said bit line at right angles.

22. A sense amplifier according to claim 21, wherein said data line is connected to said first semiconductor region via a self-alignment contact.

23. A semiconductor device comprising:
a memory cell array including a plurality of memory blocks and a plurality of sense amplifier arrays electrically connected to said memory blocks, each of said sense amplifier arrays including a plurality of sense amplifiers; wherein each of said sense amplifiers includes a column gate having a first group of circuit elements and a sense circuit having a second group of circuit elements, wherein the circuit elements of said first and second groups are integrated in the same pattern.

24. A semiconductor device according to claim 23, wherein said column gate includes at least a first transistor provided in an element region of a semiconductor substrate; and said sense circuit includes at least a second transistor provided in said element region and having a common node with said first transistor.

25. A semiconductor device according to claim 24, wherein said first transistor includes a first semiconductor region provided in said element region, a second semiconductor region provided in said element region, and a first gate electrode provided above a portion of said element region which lies between said first semiconductor region and said second semiconductor region; and said second transistor includes said second semiconductor region which is the common node with respect to said first transistor, a third semiconductor region provided in said element region, and a second gate electrode provided above a portion of said element region which lies between said second semiconductor region and said third semiconductor region.

26. A semiconductor device according to claim 25, wherein said first semiconductor region is connected to a data line; said second semiconductor region is connected to a bit line; said first gate electrode is connected to a column selection line; said third semiconductor region is connected to a sense amplifier power supply line; and said second gate electrode is connected to a reference potential line for sense amplification.

27. A semiconductor device according to claim 26, wherein said sense amplifier power supply line is a sense amplifier activating signal line and said reference potential line for sense amplification is another bit line which forms a bit line pair with said second bit line.

28. A semiconductor device according to claim 27, wherein said element region is provided in a linear form when viewed in a plan view.

29. A sense amplifier according to claim 6, wherein said linear element region intersects said bit line at right angles.

30. A semiconductor device according to claim 29, wherein said first gate electrode and said second gate electrode are parallel to said bit line and disposed above said element region.

31. A semiconductor device according to claim 30, wherein said second gate electrode has at least one portion which is bent in a direction perpendicular to said bit line above said element region.

32. A semiconductor device according to claim 31, wherein said data line is provided in a layer different from a layer in which said bit line is provided and intersects said bit line at right angles.

33. A semiconductor device according to claim 32, wherein said data line is connected to said first semiconductor region via a self-alignment contact.

34. A semiconductor device according to claim 33, further comprising a sense amplifier selection activating circuit including a third group of circuit elements, wherein the circuit elements of said second and third groups are integrated together in the layout pattern, for selecting and activating said sense circuit.

35. A semiconductor device according to claim 34, wherein said column gate includes at least a first transistor provided in an element region of a semiconductor substrate; said sense circuit includes at least a second transistor provided in said element region and having a common node with said first transistor, and said sense amplifier selection activating circuit includes at least a third transistor provided in said element region and having a common node with said second transistor.

36. A semiconductor device according to claim 35, wherein said first transistor includes a first semiconductor region provided in said element region, a second semiconductor region provided in said element region, and a first gate electrode provided above a portion of said element region which lies between said first semiconductor region and said second semiconductor region; said second transistor includes said second semiconductor region which is the common node with respect to said first transistor, a third semiconductor region provided in said element region, and a second gate electrode provided above a portion of said element region which lies between said second semiconductor region and said third semiconductor region; and said third transistor includes said third semiconductor region which is the common node with respect to said second transistor, a fourth semiconductor region provided in a different element region integrally provided with said element region, and a third gate electrode provided above a portion of said different element region which lies between said third semiconductor region and said fourth semiconductor region.

37. A semiconductor device according to claim 36, wherein said first semiconductor region is connected to a data line; said second semiconductor region is connected to a bit line; said first gate electrode is connected to a column selection line; said second gate electrode is connected to a reference potential line for sense amplification; said fourth semiconductor region is connected to a sense amplifier power supply line; said third gate electrode is connected to said column selection line.

38. A semiconductor device according to claim 37, wherein said sense amplifier power supply line is selected from the group consisting of a ground line and a sense amplifier activating signal line, and said reference potential line for sense amplification is another bit line which forms a bit line pair with said bit line.

39. A semiconductor device according to claim 38, wherein said first semiconductor region, second semiconductor region and third semiconductor region are arranged in a first direction when viewed in a plan view, and said fourth semiconductor region is arranged in a second direction perpendicular to said first direction and adjacent to said third semiconductor region.

40. A semiconductor device according to claim 39, wherein said first direction is perpendicular to said bit line and said second direction is parallel to said bit line.

41. A semiconductor device according to claim 40, wherein said first gate electrode and said second gate electrode are provided above said element region parallel to said bit line, and said third gate electrode is provided in a direction perpendicular to said bit line above said element region.

42. A semiconductor device according to claim 41, wherein said second gate electrode has at least one portion which is bent in a direction perpendicular to said bit line above said element region.

43. A semiconductor device according to claim 42, wherein said data line is provided in a layer different from a layer in which said bit line is provided and intersects said bit line at right angles.

44. A semiconductor device according to claim 43, wherein said data line is connected to said first semiconductor region by use of a self-alignment contact.

45. A semiconductor device comprising:
a memory cell array including a plurality of memory groups and sense amplifier arrays electrically connected to said plurality of memory groups, said sense amplifier arrays including a plurality of sense amplifiers; wherein each of said sense amplifiers includes a column gate having a first group of circuit elements and a sense circuit having a second group of circuit elements, wherein the circuit elements of said first and second groups are integrated in the same pattern.

46. A semiconductor device according to claim 45, wherein said column gate includes at least a first transistor provided in an element region of a semiconductor substrate; and said sense circuit includes at least a second transistor provided in said element region and having a common node with said first transistor.

47. A semiconductor device according to claim 46, wherein said first transistor includes a first semiconductor region provided in said element region, a second semiconductor region provided in said element region, and a first gate electrode provided above a portion of said element region which lies between said first semiconductor region and said second semiconductor region; and said second transistor includes said second semiconductor region which is the common node with respect to said first transistor, a third semiconductor region provided in said element region, and a second gate electrode provided above a portion of said element region which lies between said second semiconductor region and said third semiconductor region.

48. A semiconductor device according to claim 47, wherein said first semiconductor region is connected to a data line; said second semiconductor region is connected to a bit line; said first gate electrode is connected to a column selection line; said third semiconductor region is connected to a sense amplifier power supply line; and said second gate electrode is connected to a reference potential line for sense amplification.

49. A semiconductor device according to claim 26, wherein said sense amplifier power supply line is a sense amplifier activating signal line and said reference potential line for sense amplification is another bit line which forms a bit line pair with said second bit line.

50. A semiconductor device according to claim 49, wherein said element region is provided in a linear form when viewed in a plan view.

51. A sense amplifier according to claim 6, wherein said linear element region intersects said bit line at right angles.

52. A semiconductor device according to claim 51, wherein said first gate electrode and said second gate electrode are parallel to said bit line and disposed above said element region.

53. A semiconductor device according to claim 52, wherein said second gate electrode has at least one portion which is bent in a direction perpendicular to said bit line above said element region.

54. A semiconductor device according to claim 53, wherein said data line is provided in a layer different from a layer in which said bit line is provided and intersects said bit line at right angles.

55. A semiconductor device according to claim 54, wherein said data line is connected to said first semiconductor region via a self-alignment contact.

56. A semiconductor device according to claim 55, further comprising a sense amplifier selection activating circuit including a third group of circuit elements, wherein the circuit elements of said second and third groups are integrated together in the layout pattern, for selecting and activating said sense circuit.

57. A semiconductor device according to claim 56, wherein said column gate includes at least a first transistor provided in an element region of a semiconductor substrate; said sense circuit includes at least a second transistor provided in said element region and having a common node with said first transistor, and said sense amplifier selection activating circuit includes at least a third transistor provided in said element region and having a common node with said second transistor.

58. A semiconductor device according to claim 57, wherein said first transistor includes a first semiconductor region provided in said element region, a second semiconductor region provided in said element region, and a first gate electrode provided above a portion of said element region which lies between said first semiconductor region and said second semiconductor region; said second transistor includes said second semiconductor region which is the common node with respect to said first transistor, a third semiconductor region provided in said element region, and a second gate electrode provided above a portion of said element region which lies between said second semiconductor region and said third semiconductor region; and said third transistor includes said third semiconductor region which is the common node with respect to said second transistor, a fourth semiconductor region provided in a different element region integrally provided with said element region, and a third gate electrode provided above a portion of said different element region which lies between said third semiconductor region and said fourth semiconductor region.

59. A semiconductor device according to claim 58, wherein said first semiconductor region is connected to a data line; said second semiconductor region is connected to a bit line; said first gate electrode is connected to a column selection line; said second gate electrode is connected to a reference potential line for sense amplification; said fourth semiconductor region is connected to a sense amplifier power supply line; said third gate electrode is connected to said column selection line.

60. A semiconductor device according to claim 59, wherein said sense amplifier power supply line is selected from the group consisting of a ground line and a sense amplifier activating signal line, and said reference potential line for sense amplification is another bit line which forms a bit line pair with said bit line.

61. A semiconductor device according to claim 60, wherein said first semiconductor region, second semiconductor region and third semiconductor region are arranged in a first direction when viewed in a plan view, and said fourth semiconductor region is arranged in a second direction perpendicular to said first direction and adjacent to said third semiconductor region.

62. A semiconductor device according to claim 61, wherein said first direction is perpendicular to said bit line and said second direction is parallel to said bit line.

63. A semiconductor device according to claim 62, wherein said first gate electrode and said second gate electrode are provided above said element region parallel to said bit line, and said third gate electrode is provided in a direction perpendicular to said bit line above said element region.

64. A semiconductor device according to claim 63, wherein said second gate electrode has at least one portion which is bent in a direction perpendicular to said bit line above said element region.

65. A semiconductor device according to claim 64, wherein said data line is provided in a layer different from a layer in which said bit line is provided and intersects said bit line at right angles.

66. A semiconductor device according to claim 65, wherein said data line is connected to said first semiconductor region via a self-alignment contact.

67. A semiconductor device comprising:
a memory cell array including a plurality of memory blocks having a plurality of memory groups and a plurality of sense amplifier arrays electrically connected to said memory blocks, each of said sense amplifier arrays including a plurality of sense amplifiers; wherein each of said sense amplifiers includes a column gate having a first group of circuit elements and a sense circuit having a second group of circuit elements, wherein the circuit elements of said first and second groups are integrated in the same pattern.

68. A semiconductor device according to claim 67, wherein said column gate includes at least a first transistor provided in an element region of a semiconductor substrate; and said sense circuit includes at least a second transistor provided in said element region and having a common node with said first transistor.

69. A semiconductor device according to claim 68, wherein said first transistor includes a first semiconductor region provided in said element region, a second semiconductor region provided in said element region, and a first gate electrode provided above a portion of said element region which lies between said first semiconductor region and said second semiconductor region; and said second transistor includes said second semiconductor region which is the common node with respect to said first transistor, a third semiconductor region provided in said element region, and a second gate electrode provided above a portion of said element region which lies between said second semiconductor region and said third semiconductor region.

70. A semiconductor device according to claim 69, wherein said first semiconductor region is connected to a data line; said second semiconductor region is connected to a bit line; said first gate electrode is connected to a column selection line; said third semiconductor region is connected to a sense amplifier power supply line; and said second gate electrode is connected to a reference potential line for sense amplification.

71. A semiconductor device according to claim 26, wherein said sense amplifier power supply line is a sense amplifier activating signal line and said reference potential line for sense amplification is another bit line which forms a bit line pair with said second bit line.

72. A semiconductor device according to claim 71, wherein said element region is provided in a linear form when viewed in a plan view.

73. A sense amplifier according to claim 6, wherein said linear element region intersects said bit line at right angles.

74. A semiconductor device according to claim 73, wherein said first gate electrode and said second gate electrode are parallel to said bit line and disposed above said element region.

75. A semiconductor device according to claim 74, wherein said second gate electrode has at least one portion which is bent in a direction perpendicular to said bit line above said element region.

76. A semiconductor device according to claim 75, wherein said data line is provided in a layer different from a layer in which said bit line is provided and intersects said bit line at right angles.

77. A semiconductor device according to claim 76, wherein said data line is connected to said first semiconductor region via a self-alignment contact.

78. A semiconductor device according to claim 77, further comprising a sense amplifier selection activating circuit including a third group of circuit elements, wherein the circuit elements of said second and third groups are integrated together in the layout pattern, for selecting and activating said sense circuit.

79. A semiconductor device according to claim 78, wherein said column gate includes at least a first transistor provided in an element region of a semiconductor substrate; said sense circuit includes at least a second transistor provided in said element region and having a common node with said first transistor, and said sense amplifier selection activating circuit includes at least a third transistor provided in said element region and having a common node with said second transistor.

80. A semiconductor device according to claim 79, wherein said first transistor includes a first semiconductor region provided in said element region, a second semiconductor region provided in said element region, and a first gate electrode provided above a portion of said element region which lies between said first semiconductor region and said second semiconductor region; said second transistor includes said second semiconductor region which is the common node with respect to said first transistor, a third semiconductor region provided in said element region, and a second gate electrode provided above a portion of said element region which lies between said second semiconductor region and said third semiconductor region; and said third transistor includes said third semiconductor region which is the common node with respect to said second transistor, a fourth semiconductor region provided in a different element region integrally provided with said element region, and a third gate electrode provided above a portion of said different element region which lies between said third semiconductor region and said fourth semiconductor region.

81. A semiconductor device according to claim 80, wherein said first semiconductor region is connected to a data line; said second semiconductor region is connected to a bit line; said first gate electrode is connected to a column selection line; said second gate electrode is connected to a reference potential line for sense amplification; said fourth semiconductor region is connected to a sense amplifier power supply line; said third gate electrode is connected to said column selection line.

82. A semiconductor device according to claim 59, wherein said sense amplifier power supply line is selected from the group consisting of a ground line and a sense amplifier activating signal line, and said reference potential line for sense amplification is another bit line which forms a bit line pair with said bit line.

83. A semiconductor device according to claim 82, wherein said first semiconductor region, second semiconductor region and third semiconductor region are arranged in a first direction when viewed in a plan view, and said fourth semiconductor region is arranged in a second direction perpendicular to said first direction and adjacent to said third semiconductor region.

84. A semiconductor device according to claim 83, wherein said first direction is perpendicular to said bit line and said second direction is parallel to said bit line.

85. A semiconductor device according to claim 84, wherein said first gate electrode and said second gate electrode are provided above said element region parallel to said bit line, and said third gate electrode is provided in a direction perpendicular to said bit line above said element region.

86. A semiconductor device according to claim 85, wherein said second gate electrode has at least one portion which is bent in a direction perpendicular to said bit line above said element region.

87. A semiconductor device according to claim 86, wherein said data line is provided in a layer different from a layer in which said bit line is provided and intersects said bit line at right angles.

88. A semiconductor device according to claim 87, wherein said data line is connected to said first semiconductor region via a self-alignment contact.

89. A sense amplifier comprising:
   a column gate including a first group of circuit elements;
   a sense circuit including a second group of circuit elements; and
   an isolation film formed on a substrate for isolating first and second circuit regions from each other, at least one circuit element from the first group and at least one circuit element from the second group formed in said first circuit region, and at least one circuit element from the first group and at least one circuit element from the second group formed in said second region.

90. A semiconductor memory device comprising:
   a plurality of memory cells for storing data therein:
      a bit line pair having a first bit line and a second bit line, said first and second bit lines being connected to corresponding ones of said memory cells;
      a data line pair having a first data line and a second data line;
      a first active region defined by an element isolation region and including first, second and third regions, the first region being connected to said second data line, the second region being connected to said second bit line, and the third region receiving a sense signal;

a second active region isolated from said first action region and defined by said element isolation region, said second active region including fourth, fifth, and sixth regions, the fourth region being connected to said first data line, the fifth region being connected to said first bit line, and the sixth region receiving the sense signal;

a first gate electrode across said first and second active regions including a first portion between the first and second regions and a second portion between the fourth and fifth regions, the first gate electrode receiving a column select signal;

a second gate electrode across said first active region including a portion between the second and third regions, said second electrode being connected to said second bit line; and a third gate electrode across said second active region including a portion between said fifth and said sixth regions, said third gate electrode being connected to said first bit line.

91. A semiconductor memory device comprising:

a plurality of memory cells for storing data therein:

a bit line pair having a first bit line and a second bit line, said first and second bit lines being connected to corresponding ones of said memory cells;

a data line pair having a first data line and a second data line;

an active region defined by an element isolation region and including first, second, third, fourth, fifth, sixth, and seventh regions, the first region being connected to said first data line, the second region being connected to said first bit line, the third region being connected to said second data line, the fourth region being connected to said second bit line, the fifth region receiving a first sense signal, the sixth region receiving a second sense signal;

a first gate electrode across said active region including:
 a first portion between the first and second regions,
 a second portion between the third and fourth regions, and
 a third portion between the fifth and seventh regions, said first gate electrode receiving a column select signal;

a second gate electrode across said active region including a portion between the second and seventh regions, said second electrode being connected to said second bit line;

a third gate electrode across said active region including a portion between the fourth and seventh regions, said third gate electrode being connected to said first bit line; and a fourth gate electrode across said active region including a portion between the sixth and seventh regions, said fourth gate electrode receiving a power supply voltage.

92. A semiconductor memory device comprising:

a bit line pair having first and second bit lines;

a plurality of memory cells, each connected to one of said first and second bit lines;

a data line pair having first and second data lines;

a first active region defined by an element isolation region;

a second active region defined by the element isolation region and isolated from said first active region;

first and second transistors, said first transistor being connected to said first bit line, and a gate of said first transistor being connected to said second bit line, said second transistor being connected to said second bit line, and a gate of said second transistor being connected to said first bit line, and a common node between said first and second transistors being supplied with a sense signal;

a third transistor connected in series between said first bit line and said first data line, a gate of said third transistor receiving a column select signal; and a fourth transistor connected in series between said second bit line and said second data line, a gate of said fourth transistor receiving the column select signal, wherein said first and third transistors are formed in said first active region, and said second and fourth transistors are formed in said second active region.

93. A semiconductor memory device comprising:

a bit line pair having first and second bit lines;

a plurality of memory cells, each connected to one of said first and second bit lines;

a data line pair having first and second data lines;

an active region surrounded by an element isolation region;

first and second transistors, said first transistor being connected in series between said first and second bit lines, said first transistor being connected to said first bit line and a gate of said first transistor being connected to said second bit line, said second transistor being connected to said second bit line, and a gate of said second transistor being connected to said first bit line;

a third transistor for supplying a first sense signal to a common node of said first and second transistors, a gate of said third transistor receiving a power supply voltage;

a fourth transistor for supplying a second sense signal to the common node of said first and second transistors, a gate of said fourth transistor receiving a column select signal;

a fifth transistor connected in series between said first bit line and said first data line, a gate of said fifth transistor receiving the column select signal; and a sixth transistor connected in series between said second bit line and said second data line, a gate of said sixth transistor receiving the column select signal, wherein said first, second, third, fourth, fifth, and sixth transistors are formed in said active region.

* * * * *